United States Patent [19]
Urano et al.

[11] Patent Number: 6,110,646
[45] Date of Patent: Aug. 29, 2000

[54] POSITIVE PHOTOSENSITIVE COMPOSITION, PHOTOSENSITIVE LITHOGRAPHIC PRINTING PLATE AND METHOD FOR FORMING A POSITIVE IMAGE

[75] Inventors: Toshiyuki Urano; Etsuko Hino, both of Kanagawa, Japan

[73] Assignee: Mitsubishi Chemical Corporation, Tokyo, Japan

[21] Appl. No.: 09/133,413

[22] Filed: Aug. 13, 1998

[30] Foreign Application Priority Data

Aug. 13, 1997 [JP] Japan ..................................... 9-218544
Oct. 24, 1997 [JP] Japan ..................................... 9-291880

[51] Int. Cl.$^7$ ..................................................... G03F 7/004
[52] U.S. Cl. ....................... 430/302; 430/270.1; 430/342; 430/292; 430/343; 430/915; 430/922; 430/924; 430/926
[58] Field of Search ................................ 430/270.1, 302, 430/342, 343, 345, 915, 922, 924, 926, 292

[56] References Cited

U.S. PATENT DOCUMENTS 5,372,907  12/1994  Haley et al. .
5,491,046   2/1996  Deboer et al. .
5,663,037   9/1997  Haley et al. .

FOREIGN PATENT DOCUMENTS 9-43847      2/1997  Japan .
WO 97/39894 10/1997  WIPO .

*Primary Examiner*—Janet Baxter
*Assistant Examiner*—Barbara Gilmore
*Attorney, Agent, or Firm*—Oblon, Spivak, McClelland, Maier & Neustadt, P.C.

[57] ABSTRACT

A positive photosensitive composition comprising an alkali-soluble organic high molecular substance having phenolic hydroxyl groups and an acid color forming dye.

17 Claims, No Drawings

POSITIVE PHOTOSENSITIVE COMPOSITION, PHOTOSENSITIVE LITHOGRAPHIC PRINTING PLATE AND METHOD FOR FORMING A POSITIVE IMAGE

The present invention relates to a novel positive photosensitive composition sensitive to lights within a wavelength region of from ultraviolet to near infrared, which is useful for a photosensitive lithographic printing plate, a simplified proof reading plate, a copper etching resist for gravure or patch boards, a resist for a color filter to be used for the production of a flat display or a photoresist for the production of LSI. Particularly, it relates to a positive photoresist composition suitable for direct plate making by means of a semiconductor laser or a YAG laser, a positive photosensitive lithographic printing plate and a method for forming a positive image.

Along with the progress in the image treating technology by computers, an attention has been drawn to a photosensitive or heat sensitive direct plate making system wherein a resist image is formed directly from digital image information by a laser beam or a thermal read without using a silver salt masking film.

Especially, it has been strongly desired to realize a high resolution laser photosensitive direct plate making system employing a high power semiconductor laser or YAG laser, from the viewpoint of downsizing, the environmental light during the plate making operation and plate making costs.

On the other hand, as image-forming methods wherein laser photosensitivity or heat sensitivity is utilized, there have heretofore been known a method of forming a color image by means of a sublimable transfer dye and a method of preparing a lithographic printing plate.

In recent years, a technique in which a chemical amplification type photoresist is combined with a long wavelength light ray absorbing dye, has been proposed. For example, JP-A-6-43633 discloses a photosensitive material wherein a certain specific squarilium dye is combined with a photo-acid-generator and a binder.

Further, as a technique of this type, a technique for preparing a lithographic printing plate by exposing a photosensitive layer containing an infrared ray absorbing dye, latent Bronsted acid, a resol resin and a novolak resin, in an image pattern by e.g. a semiconductor laser, has been proposed (JP-A-7-20629). Further, the same technique wherein a s-triazine compound is used instead of the above latent Bronsted acid, has also been proposed (JP-A-7-271029).

Further, JP-9-43847 discloses a resist material wherein the crystalizability of a photosensitive material is changed by heating by irradiation with infrared light rays, and a method for forming a pattern utilizing it.

Still further, WO97/39894 discloses a lipophilic heat sensitive composition containing a high molecular substance soluble in an aqueous developer and a compound capable of lowering the solubility of the high molecular weight substance in the aqueous developer, and it is disclosed that with such a composition, the solubility in the aqueous developer does not increase by irradiation with ultraviolet (UV) light, although the solubility in the aqueous developer increases when the composition is heated.

However, it has been found by our study that these conventional techniques were not necessarily adequate in their performance from the practical viewpoint. For example, in the case of a negative photosensitive material which requires heat treatment after exposure, the stability of the image quality obtainable was not necessarily satisfactory, due to variation of the treating conditions. On the other hand, in the case of a positive photosensitive material which requires no such heat treatment after exposure, the difference in the solubility in the developer as between an exposed portion and a non-exposed portion (hereinafter referred to simply as "contrast") was inadequate, and consequently, a non-image portion was not sufficiently removed, or the film-remaining ratio at an image portion was not sufficiently maintained.

Further, it has been found by our study that with the above photosensitive materials, the exposure visible image quality tends to be inadequate which serves to identify completion of exposure by a decrease in the color density at an exposed portion after exposure of the photosensitive material. Further, it has been found that when the photosensitive materials, specifically the photosensitive lithographic printing plates, are subjected to developing treatment in a large amount, the colorant in the photosensitive materials tends to color the developer, thus leading to problems such as staining of an automatic developer tank and further re-deposition of the colorant deposited on the developer tank during development, to the photosensitive lithographic printing plates.

The present invention has been made in view of the mentioned various problems, and it is an object of the present invention to provide a novel positive photosensitive composition and a positive photosensitive lithographic printing plate, which are excellent in the contrast between an image portion and a non-image portion and which provide an adequate film-remaining ratio at the image portion.

Another object of the present invention is to provide a novel positive photosensitive composition and a positive photosensitive lithographic printing plate, which are excellent in the exposure visible image quality and which are free from staining the developer tank even when developing treatment is repeated.

Such objects of the present invention can be accomplished by the following constructions of the present invention:

A positive photosensitive composition comprising an alkali-soluble organic high molecular substance having phenolic hydroxyl groups and an acid color forming dye. It is preferred that at least a part of the acid color forming dye forms a proton transfer complex with the alkali-soluble organic high molecular substance having phenolic hydroxyl groups.

A positive photosensitive lithographic printing plate having a layer made of the above positive photosensitive composition, formed on a support.

A method for forming a positive image, which comprises subjecting the above positive photosensitive lithographic printing plate to exposure with a near infrared light of from 650 to 1,300 nm, followed by development with an alkali developer.

Now, the present invention will be described in detail. The present invention is characterized in that the positive photosensitive composition comprises an acid color forming dye and an alkali-soluble organic high molecular substance having phenolic hydroxyl groups. The respective components of the composition of the present invention will be described hereinafter, but it is believed that at least a part of the acid color forming dye forms a proton transfer complex with the alkali-soluble organic high molecular substance having phenolic hydroxyl groups, and when the composition is exposed, the solubility of the exposed portion in the developer, is improved, whereby a positive image can be formed. Such a proton transfer complex is formed by discharge of protons to the acid color forming dye by the phenolic hydroxyl groups of the alkali-soluble organic high molecular substance.

Such a proton transfer complex is usually hardly formed merely by mixing the alkali-soluble high molecular substance having phenolic hydroxyl groups and the acid color forming dye, and the formation is usually accelerated by carrying out heat treatment. As one of means to ascertain the presence or absence of the formation of the proton transfer complex in the present invention, presence or absence of color development of the acid color forming dye, may be mentioned. As another means to ascertain the formation of the proton transfer complex, it may be mentioned that as the acid color forming dye is contained, the film reduction at the image portion after exposure and development by an alkali developer is small (the film-remaining ratio at the image portion is high) as compared with a case where no acid color forming dye is contained. The mechanism for such formation of a proton transfer complex may be illustrated as follows.

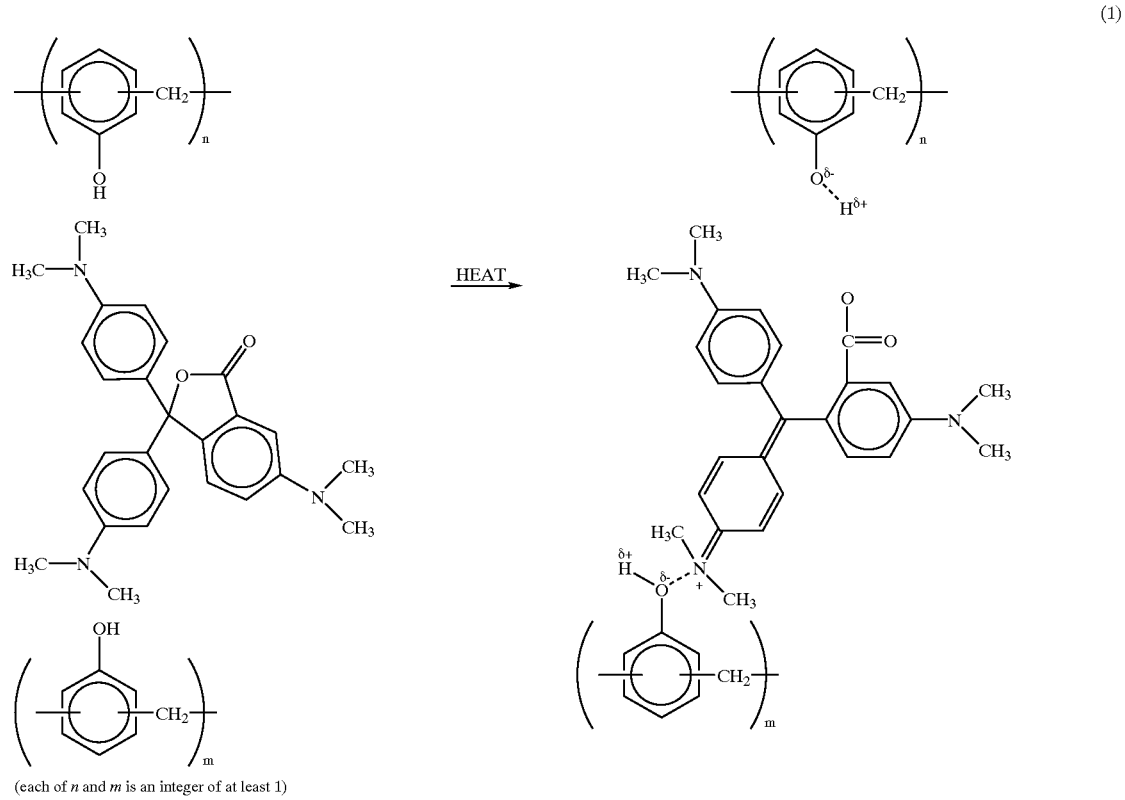

(each of n and m is an integer of at least 1)

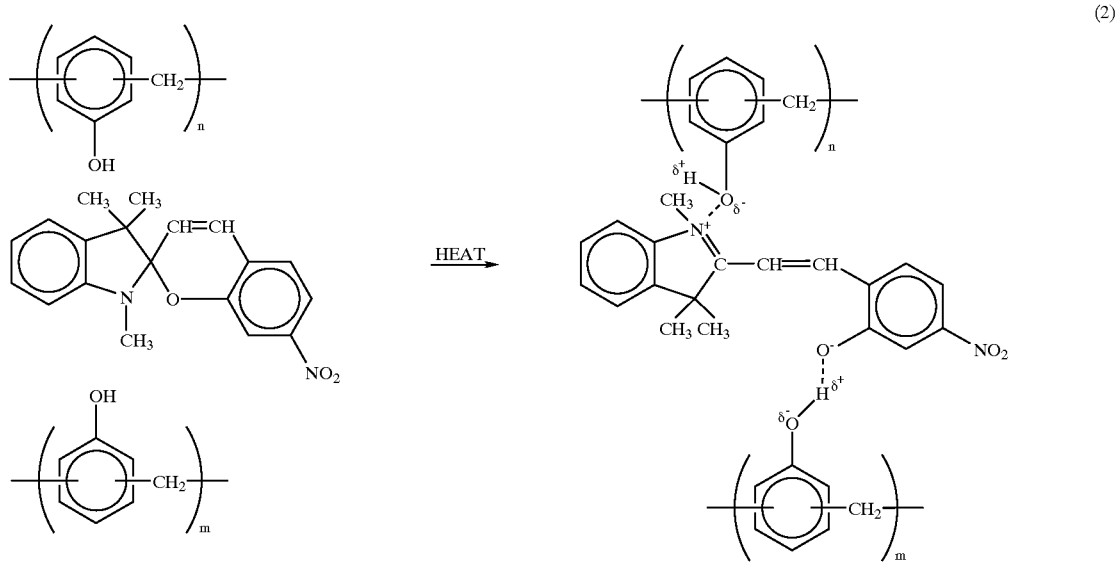

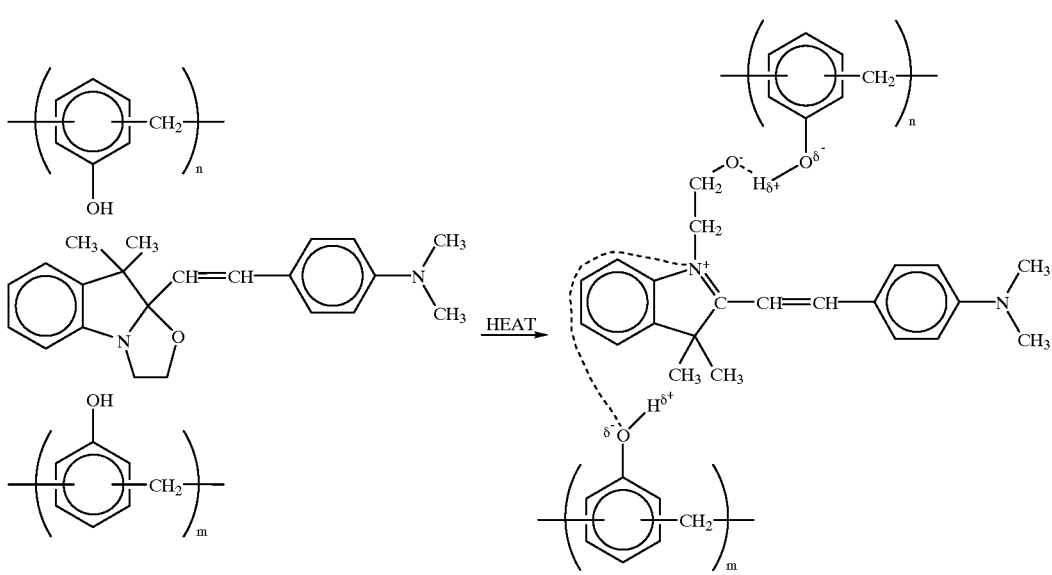

(3)

The detailed mechanism for formation of a positive image by the photosensitive composition of the present invention is not known. However, it is considered that by the formation of the proton transfer complex, the phenolic hydroxyl groups of the alkali-soluble organic high molecular substance form a matrix structure by hydrogen bonds with the complex at the center, whereby a high resolution-suppressing effect against the aqueous alkali solution of the alkali-soluble organic high molecular substance will be obtained. On the other hand, during irradiation, the matrix structure is dissociated by a photochemical change of the acid color forming dye constituting the proton transfer complex, or by a change by heat generated by absorption of light, whereby the dye concentration decreases, and the high dissolution-suppressing effect diminishes, so that it is possible to form a positive image having a contrast between an exposed portion and a non-exposed portion.

The above mentioned acid color forming dye may form a proton transfer complex in its entirety.

As described in the forgoing, the positive photosensitive composition of the present invention has the following characteristics.

(1) A photosensitive composition comprising an alkali-soluble organic high molecular substance having phenolic hydroxyl groups and an acid color forming dye.

(2) A positive photosensitive composition comprising an alkali-soluble organic high molecular substance having phenolic hydroxyl groups and an acid color forming dye, wherein at least a part of the acid color forming dye forms a proton transfer complex with the alkali-soluble high molecular substance having phenolic hydroxyl groups.

(3) A positive photosensitive composition comprising an alkali-soluble organic high molecular substance having phenolic hydroxyl group and an acid color forming dye, wherein the acid color forming dye has the color formed.

Now, the components constituting the composition of the present invention will be described.

The alkali-soluble organic high molecular substance having phenolic hydroxyl groups of the present invention may, for example, be a novolak resin, a resol resin, a polyvinyl phenol resin, or a copolymer of an acrylic acid derivative having a phenolic hydroxyl group. Among them, a novolak resin, a resol resin or a polyvinyl phenol resin is preferred. Particularly preferred is a novolak resin or a polyvinyl phenol resin.

The novolak resin may be one prepared by polycondensing at least one member selected from aromatic hydrocarbons such as phenol, m-cresol, o-cresol, p-cresol, 2,5-xylenol, 3,5-xylenol, resorcinol, pyrogallol, bisphenol, bisphenol-A, trisphenol, o-ethyphenol, m-ethylphenyl, p-ethylphenol, propylphenol, n-butylphenol, t-butylphenol, 1-naphthol and 2-naphthol, with at least one aldehyde or ketone selected from aldehydes such as formaldehyde, acetoaldehyde, propionaldehyde, benzaldehyde and furfural and ketones such as acetone, methyl ethyl ketone and methyl isobutyl ketone, in the presence of an acid catalyst.

Instead of the formaldehyde and acetaldehyde, paraformaldehyde and paraldehyde may, respectively, be used. The weight average molecular weight calculated as polystyrene, measured by gel permeation chromatography (hereinafter referred to simply as GPC), of the novolak resin (the weight average molecular weight by the GPC measurement will hereinafter be referred to as Mw) is preferably from 1,000 to 150,000, more preferably from 1,500 to 100,000.

The aromatic hydrocarbon of a novolak resin may, for example, be preferably a novolak resin obtained by polycondensing at least one phenol selected from phenol, o-cresol, m-cresol, p-cresol, 2,5-xylenol, 3,5-xylenol and resorcinol, with at least one member selected from aldehydes such as formaldehyde, acetaldehyde and propionaldehyde.

Among them, preferred is a novolak resin which is a polycondensation product of an aldehyde with a phenol comprising m-cresol/p-cresol/2,5-xylenol/3,5-xylenol/resorcinol in a mixing molar ratio of 40 to 100/0 to 50/0 to 20/0 to 20/0 to 20, or with a phenol comprising phenol/m-cresol/p-cresol in a mixing molar ratio of 1 to 100/0 to 70/0 to 60. Among aldehydes, formaldehyde is particularly preferred. Further, as described hereinafter, the photosensitive composition of the present invention may further contain a solubility-suppressing agent. In such a case, preferred is a novolak resin which is a polycondensation product of an aldehyde with a phenol comprising m-cresol/p-cresol/2,5-xylenol/3,5-xylenol/resorcinol in a mixing molar ratio of 70 to 100/0 to 30/0 to 20/0 to 20, or with a phenol comprising phenol/m-cresol/p-cresol in a mixing molar ratio of 10 to 100/0 to 60/0 to 40.

The polyvinyl phenol resin may be a polymer of one or more hydroxystyrenes such as o-hydroxystyrene, m-hydroxystyrene, p-hydroxystyrene, 2-(o-hydroxyphenyl)propylene, 2-(m-hydroxyphenyl)propylene and 2-(p-hydroxyphenyl)propylene. Such a hydroxystyrene may have a substituent such as a halogen such as chlorine, bromine, iodine or fluorine, or a $C_{1-4}$ alkyl group, on its aromatic ring. Accordingly, the polyvinyl phenol may be a polyvinyl phenol having a halogen or a $C_{1-4}$ alkyl substituent on its aromatic ring.

The polyvinyl phenol resin is usually prepared by polymerizing one or more hydroxystyrenes which may have substituents in the presence of a radical polymerization initiator or a cationic polymerization initiator. Such a polyvinyl phenol resin may be the one subjected to partial hydrogenation. Or, it may be a resin having a part of OH groups of a polyvinyl phenol protected by e.g. t-butoxycarbonyl groups, pyranyl group or furanyl groups. Mw of the polyvinyl phenol resin is preferably from 1,000 to 100,000, more preferably from 1,500 to 50,000.

More preferably, the polyvinyl phenol resin is a polyvinyl phenol which may have a $C_{1-4}$ alkyl substituent on its aromatic ring, particularly preferably an unsubstituted polyvinyl phenol.

If Mw of the above novolak resin or polyvinyl phenol resin is smaller than the above range, no adequate coating film tends to be obtained, and if it exceeds the above range, the solubility of the non-exposed portion in an alkali developer tends to be small, whereby a pattern tends to be hardly obtainable.

The resol resin can be obtained in the same manner as the synthesis of the novolak resin except that instead of an acid catalyst, an alkali catalyst is employed. The resol resin is preferably one having the same preferred molecular weight and the polycondensation monomer composition as for the novolak resin.

Among alkali-soluble organic high molecular substances having phenolic hydroxyl groups, the novolak resin is preferred.

The acid color forming dye to be used in the present invention, is not particularly limited as long as it has a function to form a color by the action of an acid. Typically, the acid color forming dye is a dye having in its molecule a bond dissociable by the presence of hydrogen ions or an acid such as a Lewis acid or a Bronsted acid, so that by the dissociation of this bond, a cation is formed in the molecule, and cation takes a delocalized resonance color forming structure via an ethylene chain and/or an aromatic ring, to form a color. More specifically, the acid color forming dye shows no or little absorption of visible light by itself and when 100 parts by weight of a phenolic novolak resin (as used in Example 1 hereinafter) and 10 parts by weight of the acid color forming dye are dissolved in methyl cellosolve (1,000 parts by weight), and the solution is coated on a support and dried at 80° C. for 2 minutes to form a coating film of 2.5 µm, an absorption of at least ten times the absorption by the acid color forming dye itself, is observed in a visible light region.

The acid color forming dye to be used in the present invention is preferably one having in its molecule at least one nitrogen, oxygen or sulfur atom capable of forming an ammonium ion, an oxonium ion or a sulfonium ion by an addition of a proton, so that such an atom forms a cation, and it has a counter anion in its molecule or outside the molecule to take a color developing structure.

Accordingly, so long as the skeleton of the dye has an acid color forming structure, substituents which the dye skeleton may have, are not particularly limited unless they hinder the formed localized cation structure.

Specific examples of preferred acid color forming dyes are shown by the following formulae (A1) to (A4). Among them, a dye having a lactone skeleton in its structure, particularly a dye ((A1) or (A2)) having a γ-lactone skeleton in its structure, is advantageous from the viewpoint of the acid dissociable property and the acid color forming property. (A2) represents a preferred structure among (A1).

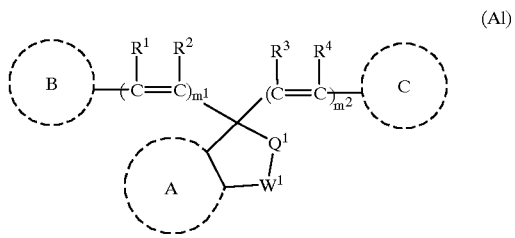

(A1)

wherein each of rings A, B and C which are independent of one another, is a mono- to tri-nuclear aromatic hydrocarbon group which may have a substituent, or a mono- to tri-nuclear aromatic heterocyclic group which may have a substituent, $W^1$ is a carbonyl group, a thio carbonyl group or a group of the formula —C($R^{25}$)=N—, $R^{25}$ is a hydrogen atom or a hydrocarbon group which may have a substituent, Q1 is an oxygen atom, a sulfur atom or an imino group which may have a substituent, each of $R^1$ to $R^4$ which are independent of one another, is a hydrogen atom or a hydrocarbon group which may have a substituent, $m^1$ is an integer of from 0 to 2, $m^2$ is an integer of from 0 to 2, and rings B and C may be bonded via a connecting group, provided that ring B and/or ring C has at least one substituent selected from an amino group which may have a substituent, an alkoxy group which may have a substituent, an aryloxy group which may have a substituent, an alkylthio group which may have a substituent, and an arylthio group which may have a substituent.

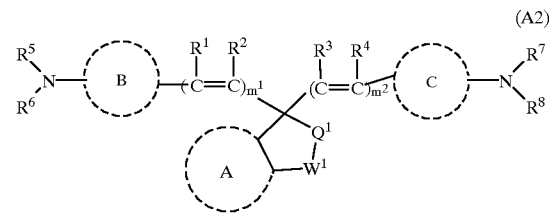

(A2)

wherein each of rings A, B and C which are independent of one another, is a mono- to tri-nuclear aromatic hydrocarbon group which may have a substituent, or a mono- to tri-aromatic heterocyclic group which may have a substituent, $W^1$ is a carbonyl group, a thio carbonyl group or a group of the formula —C($R^{25}$)=N—, $R^{25}$ is a hydrogen atom or a hydrocarbon group which may have a substituent, Q1 is an oxygen atom, a sulfur atom or an imino group which may have a substituent, each of $R^1$ to $R^4$ which are independent of one another is a hydrogen atom or a hydrocarbon group which may have a substituent, $m^1$ is an integer of from 0 to 2, $m^2$ is an integer of from 0 to 2, each of $R^5$ to $R^8$ which are independent of one another, is a hydrogen atom, a hydrocarbon group which may have a substituent, or an acyl group which may have a substituent, and rings B and C may be bonded to each other via a connecting group, $R^5$ or $R^6$ and ring B may be bonded to each other via a connecting group, and $R^7$ or $R^8$ and ring C may be bonded to each other via a connecting group.

Among acid color forming dyes of the formula (A1) and (A2), preferred are compounds wherein $Q^1$ is an oxygen atom or a sulfur atom, $W^1$ is a carbonyl group or a thiocarbonyl group, ring A is a benzene ring, a piperazine ring, a thiophene ring, a benzothiophene ring, a furan ring, a benzofuran ring, an indole ring or a pyridine ring, each of rings B and C is a benzene ring or a naphthalene ring, and each of $m^1$ and $m^2$ is 0 or 1, each of $R^1$ to $R^4$ which are independent of one another, is a hydrogen atom, a $C_{1-5}$ alkyl group or a $C_{6-8}$ aryl group, and $R^{25}$ is a hydrogen atom, a $C_{1-15}$ alkyl group or a $C_{6-15}$ allyl group. Further, among them, more preferred are these wherein $Q^1$ is an oxygen atom, $W^1$ is a carbonyl group, ring A is a benzene ring, and each of $R^1$ to $R^4$ which are independent of one another, is a hydrogen atom, a methyl group, an ethyl group or a phenyl group.

Further, rings A, B and C may have substituents which do not hinder the formed delocalized cation structure. Such substituents may specifically be, for example, a hydrogen atom, a hydroxyl group, a halogen atom, a cyano group, a trimethylsilyloxy group, a $C_{1-15}$ alkyl group which may have a substituent, a $C_{2-15}$ acyl group which may have a substituent, a $C_{1-15}$ alkoxy group which may have a substituent, a $C_{1-15}$ alkyltio group which may have a substituent, a $C_{1-15}$ alkylsulfinyl group which may have a substituent, a $C_{1-15}$ alkylsulfonyl group which may have a substituent, a $C_{6-15}$ aryloxy group which may have a substituent, a $C_{6-15}$ arylthio group which may have a substituent, a $C_{2-15}$ acyloxy group which may have a substituent, a $C_{2-15}$ alkoxy carbonyl group which may have a substituent and an amino group which may have a substituent. Among them, preferred is a hydrogen atom, a hydroxyl group, a chlorine atom, a bromine atom, a trifluoromethyl group, a $C_{1-10}$ alkyl group, a phenyl group, a tolyl group, a $C_{2-5}$ acyl group, a $C_{2-5}$ acyloxy group, a $C_{1-5}$ dialkylamino group, a $C_{1-5}$ alkylamino group, a phenylamino group, a phenylmethylamino group, a $C_{1-5}$ alkoxy group, a $C_{1-5}$ alkyltio group, a phenoxy group or a phenylthio group.

Further, rings B and C may be bonded to each other via a connecting group. In such a case, the connecting group may, for example, be an oxygen atom, a sulfur atom, a methylene group or an ethylene group, and preferred is an oxygen atom. When rings B and C are bonded, it is more preferred that both $m^1$ and $m^2$ are 0, and rings B and C are bonded at the o-position to form a 6-membered ring.

In the formula (A1), ring B and/or ring C has at least one substituent selected from an amino group which may have a substituent, an alkoxy group which may have a substituent, an aryloxy group which may have a substituent, an alkylthio group which may have a substituent and an arylthio group which may have a substituent. It is preferred that each of rings B and C has at least one such substituent. It is more preferred that each of rings B and C has at least one amino group which may have a substituent, and this corresponds to the formula (A2).

In the acid color forming dye of the formula (A2), each of $R^5$ to $R^8$ which are independent of one another, is preferably a hydrogen atom, a $C_{1-10}$ alkyl group, a $C_{5-7}$ cycloalkyl group, a $C_{6-10}$ aryl group which may be substituted by a halogen atom or a trifluoromethyl group, or a $C_{2-7}$ alkoxyalkyl group, more preferably, a hydrogen atom, a methyl group, an ethyl group, a 1-propyl group, a 2-propyl group, a 1-butyl group, a 2-butyl group, a 1-pentyl group, a 2-pentyl group, a 2-methyl-1-propyl group, a cyclohexyl group, a phenyl group, a toryl group or a 3-trifluoromethylphenyl group

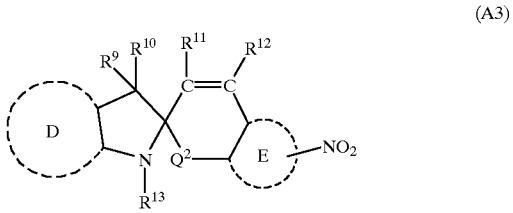

(A3)

wherein each of rings D and E which are independent of each other, is a mono- to tri-nuclear aromatic hydrocarbon which may have a substituent, or a mono- to tri-nuclear aromatic heterocyclic group which may have a substituent, $Q^2$ is an oxygen atom or a sulfur atom, each of $R^9$ to $R^{12}$ which are independent of one another, is a hydrogen atom, a halogen atom or a hydrocarbon group which may have a substituent, and $R^{13}$ is a hydrogen atom or a hydrocarbon group which may have a substituent.

Among acid color forming dyes of the formula (A3), preferred are compounds wherein $Q^2$ is an oxygen atom, ring D is a benzene ring, a piperazine ring, a thiophene ring, a benzothiophene ring, a furan ring, a benzofuran ring, an indole ring or a pyridine ring, ring E is a benzene ring or a naphthalene ring, each of $R^9$ to $R^{12}$ which are independent of one another, is a hydrogen atom, a $C_{1-5}$ alkyl group which may be substituted by a halogen atom, or a $C_{6-8}$ aryl group which may be substituted by a halogen atom, and $R^{13}$ is a hydrogen atom, a $C_{1-5}$ alkyl group or a $C_{6-8}$ aryl group. Among them, more preferred are those wherein ring D is a benzene ring, each of $R^9$ and $R^{10}$ is a methyl group, each of $R^{11}$ and $R^{12}$ is a hydrogen atom or a methyl group, and $R^{13}$ is a methyl group or an ethyl group.

Rings D and E may have substituents which do not hinder the formed delocalized cation structure, and such substituents may be the same as the substituents on rings A, B and C described with respect to the formulae (A1) and (A2).

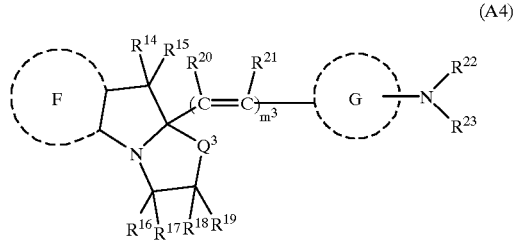

(A4)

wherein rings F and G which are independent of each other, is a mono- to tri-nuclear aromatic hydrocarbon group which may have a substituent, or a mono- to tri-nuclear aromatic heterocyclic group which may have a substituent, each of $R^{14}$ to $R^{21}$ which are independent of one another, is a hydrogen atom, a halogen atom or a hydrocarbon group which may have a substituent, each of $R^{22}$ and $R^{23}$ which are independent of each other, is a hydrogen atom, a hydrocarbon group which may have a substituent, or an acyl group which may have a substituent, $Q^3$ is an oxygen atom or a sulfur atom, and $m^3$ is 1 or 2.

Among acid color forming dyes of the formula (A4), preferred are compounds wherein $Q^2$ is an oxygen atom, ring F is a benzene ring, a piperazine ring, a thiophene ring, a benzothiophene ring, a furan ring, a benzofuran ring, an indole ring or a pyridine ring, ring G is a benzene ring or a naphthalene ring, each of $R^{14}$ to $R^{21}$ which are independent of one another, is a hydrogen atom, a $C_{1-5}$ alkyl group, a $C_{6-8}$ aryl group or a halogen atom, each of $R^{22}$ and $R^{23}$ is a hydrogen atom, a $C_{1-5}$ alkyl group, a $C_{2-6}$ acyl group or a $C_{6-8}$ aryl group. Among them, more preferred are those wherein ring F is a benzene ring, each of $R^{14}$ and $R^{15}$ which are independent of each other, is a methyl group, each of $R^{16}$ to $R^{21}$ which are independent of one another, is a hydrogen atom or methyl group, and each of $R^{22}$ and $R^{23}$ which are independent of each other, is a hydrogen atom, a methyl group, an ethyl group or an acetyl group.

Rings F and G may have substituents which do not hinder the formed delocalized cation structure. Such substituents may be the same as the substituents on the above described rings A, B and C.

Further, the acid color forming dye of the present invention may be a compound having a plurality of dyes, wherein at least two acid color forming dyes as described above, are directly or via a connecting group bonded to one another.

The method for bonding a plurality of acid color forming dyes, is not particularly limited so long as the acid color forming dyes can be directly or via a connecting group bonded to one another. Such a bonding method will be further described with reference to specific examples.

1) Reaction for reacting a benzoyl benzoic acid derivative to a biphenyl amino derivative.

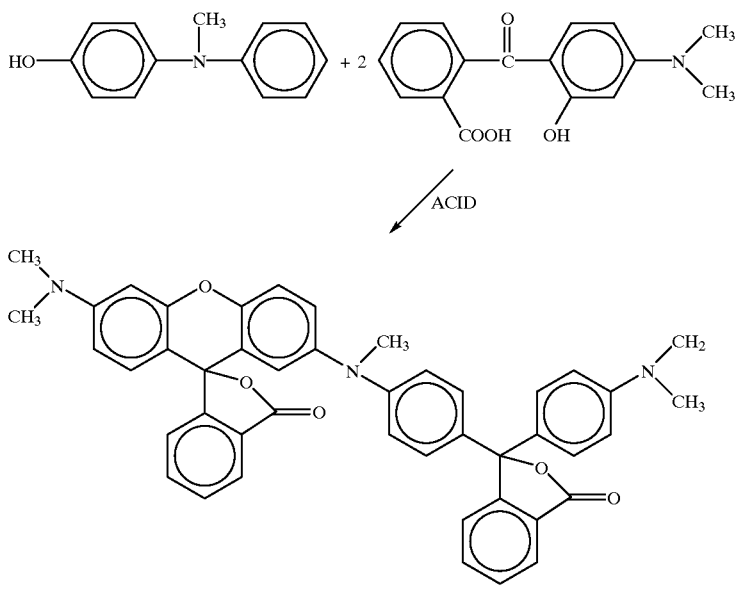

2) Method for reacting an aldehyde compound or a ketone compound to an acid color forming dye having a biphenyl amino group.

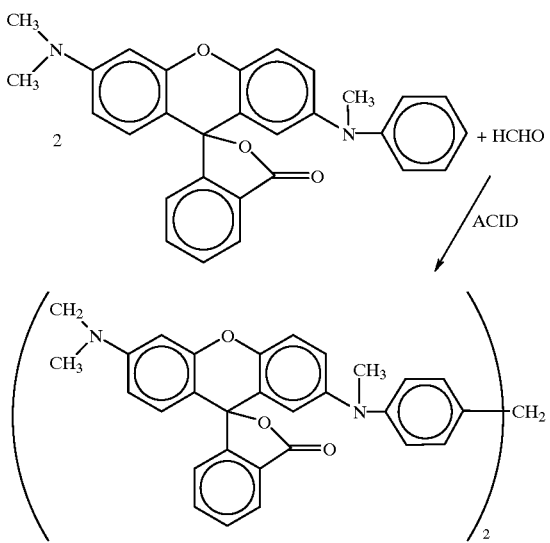

Now, among the above mentioned compounds having a plurality of acid color forming compounds, an organic high molecular substance having a plurality of acid color forming dyes, will be described.

As a method for forming an organic high molecular substance having a plurality of acid color forming dyes, the following may, for example, be mentioned.

1) Method wherein an acid color forming dye having a diphenyl amino group is poly-condensed with an aldehyde compound or a ketone compound. At the time of this polycondensation, a diphenyl amine derivative or a phenol derivative which condenses with the aldehyde compound or the ketone compound, may be co-polycondensed.

If the molecular weight is too high, the solubility of the photosensitive layer in the developer tends to be low, whereby formation of a photosensitive layer residue (greasing) is likely to occur at a non-image portion.

Further, in a case where the organic high molecular substance having a plurality of acid color forming dyes, has a film-forming property by itself, and the organic high molecular substance having a plurality of acid color forming dyes and the plurality of acid color forming dyes contained in the organic high molecule substance, can form a proton transfer complex, the desired positive photosensitive com-

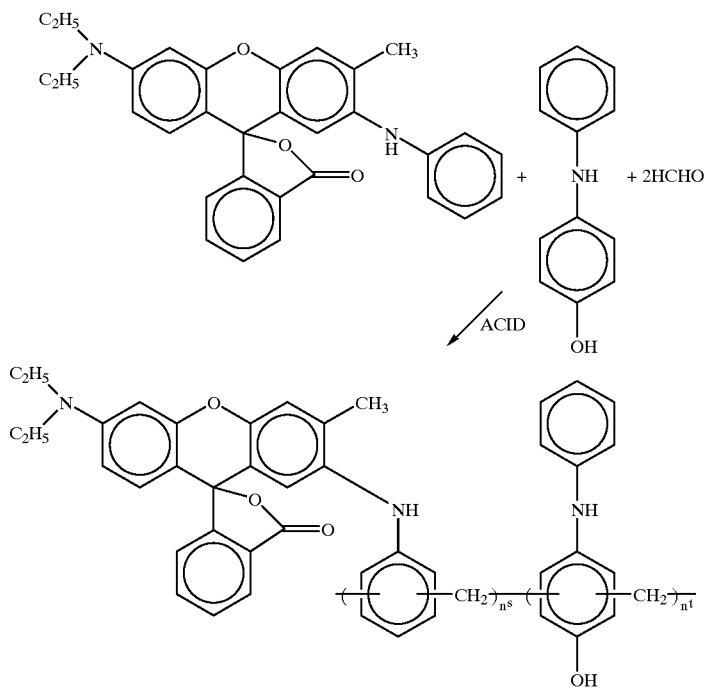

wherein each of $n^s$ and $n^r$ is an integer of at least 1.

When the compound having a plurality of acid color forming dyes is an organic polymer, the weight average molecular weight (Mw) is usually from 1,000 to 1,000,000, preferably from 1,000 to 500,000, more preferably from 1,000 to 100,000.

position can be obtained without using the alkali-soluble organic high molecular substance having phenolic hydroxyl groups.

Among the above compounds having a plurality of acid color forming dyes, preferred are those having structures of the following formulae (B1) to (B3):

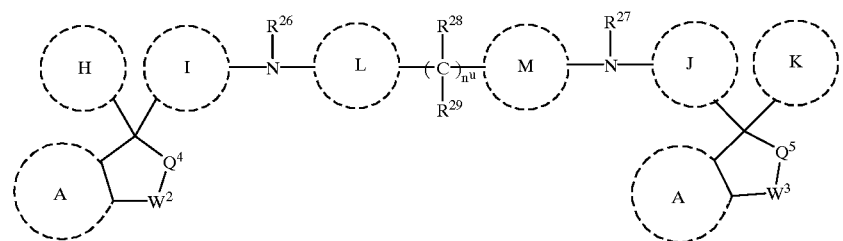

(B1)

(B2)

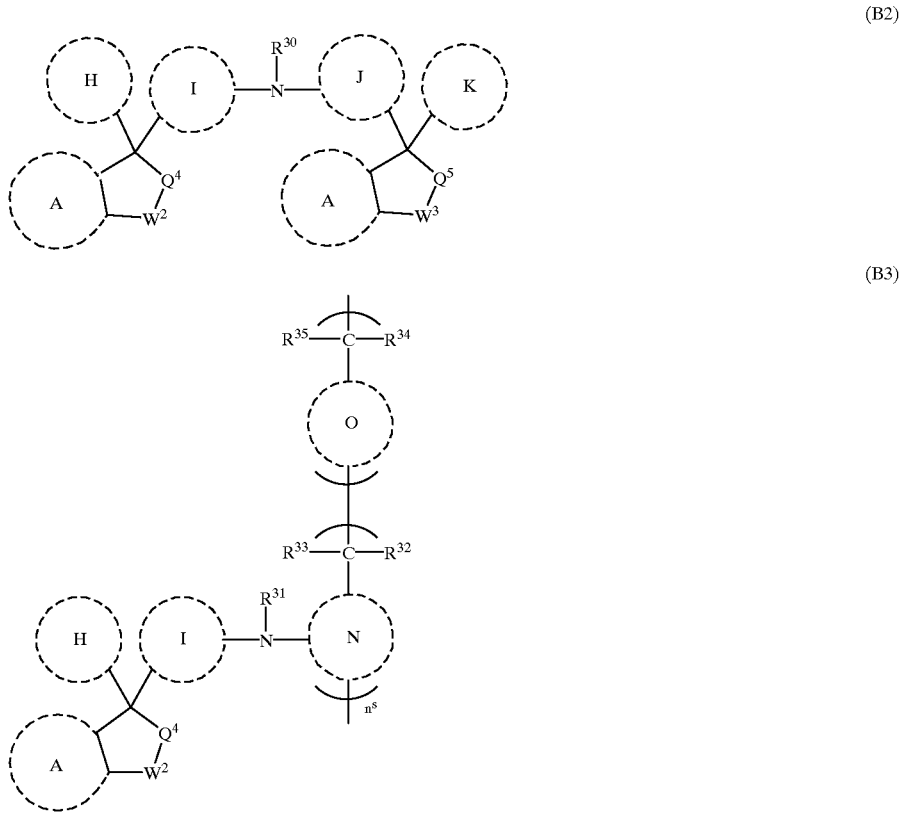

(B3)

wherein each of rings A, H, I, J, and K which are independent of one another, is a mono- to tri-nuclear aromatic hydrocarbon group which may have a substituent, or a mono- to tri-nuclear aromatic heterocyclic group which may have a substituent, each of rings L, M, N and O which are independent of one another, is a benzene ring which may have a substituent, each of $W^2$ and $W^3$ which are independent of each other, is a carbonyl group, a thiocarbonyl group or a group of the formula —C($R^{25}$)=N—, $R^{25}$ is a hydrogen atom or a hydrocarbon group which may have a substituent, each of $Q^4$ and $Q^5$ which are independent of each other, is an oxygen atom, a sulfur atom or an imino group which may have a substituent, each of $R^{26}$, $R^{27}$, $R^{30}$ and $R^{31}$ which are independent of one another, is a hydrogen atom or a hydrocarbon group, each of $R^{28}$, $R^{29}$ and $R^{32}$ to $R^{35}$ which are independent of one another, is a hydrogen atom, a halogen atom or a hydrocarbon group, each of $n^s$ and $n^t$ is an integer of at least 1, $n^u$ is an integer of from 1 to 5, and rings H and I may be bonded to each other via a connecting group.

Each of the above acid color forming dyes of the formulae (B1) to (B3) has a nitrogen atom which is capable of forming an ammonium ion by an addition of a proton, but it is further preferred that each of them has, as a substituent on ring H or K, a substituent selected from an amino group which may have a substituent, an alkoxy group which may have a substituent, an aryloxy group which may have a substituent, an alkylthio group which may have a substituent and an arylthio group which may have a substituent, so that a nitrogen atom, an oxygen atom or a sulfur atom in such a substituent forms an ammonium ion, an oxonium ion or a sulfonium ion by an addition of a proton, and it takes a structure having a color developing nature by having a counter anion in its molecule or outside the molecule.

Further, rings A, H, I, J, K, L and M may have substituents which do not hinder the formed delocalized cation structure. Such substituents may be the same as the substituents on rings A, B and C, as described above with reference to the formulae (A1) and (A2).

Among the above acid color forming dyes of the formulae (B1) to (B3), preferred are compounds wherein each of $Q^4$ and $Q^5$ is an oxygen atom or a sulfur atom, each of $W^2$ and $W^3$ is a carbonyl group or a thiocarbonyl group, ring A is a benzene ring, a piperazine ring, a thiophene ring, a benzothiophene ring, a furan ring, a benzofuran ring, an indole ring or a pyridine ring, each of rings H, I, J and K is a benzene ring or a naphthalene ring, each of $R^{26}$, $R^{27}$, $R^{30}$ and $R^{31}$ which are independent of one another, is a hydrogen atom, a $C_{1-15}$ alkyl group, a $C_{6-15}$ allyl group, each of $R^{28}$, $R^{29}$ and $R^{32}$ to $R^{35}$ which are independent of one another, is a hydrogen atom, a $C_{1-15}$ alkyl group, a $C_{6-15}$ allyl group, and $R^{25}$ is a hydrogen atom, a $C_{1-15}$ alkyl group or a $C_{6-15}$ allyl group. Among the acid color forming dyes of the formulae (A1) to (A4) and (B1) to (B3), those of the formulae (A1) and (A2) are more preferred, and particularly preferred is (A2).

Specific examples of the acid color forming dye of the present invention will be presented below, but the acid color forming dye of the present invention is by no means restricted to such specific examples.

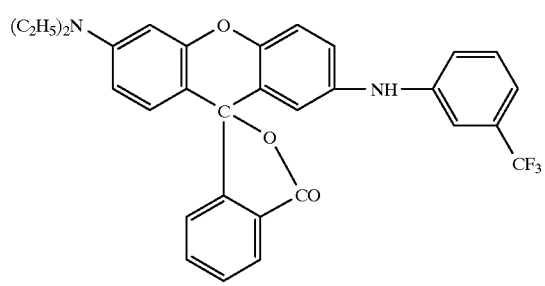
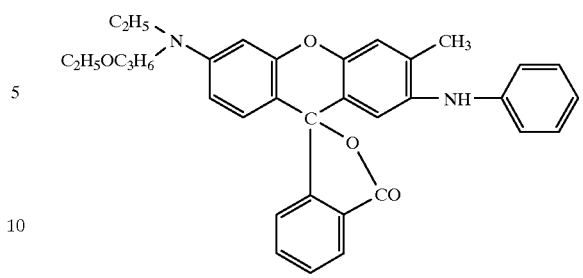
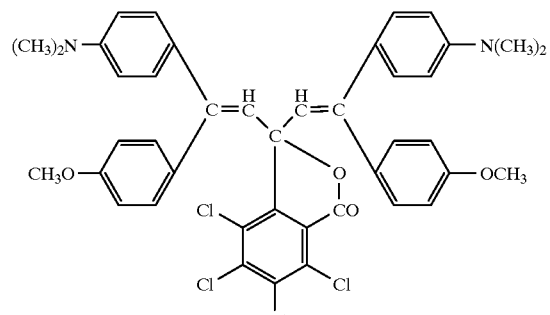
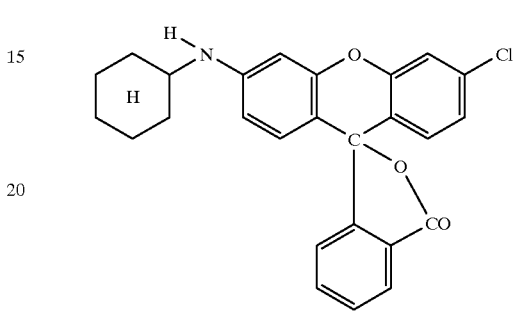
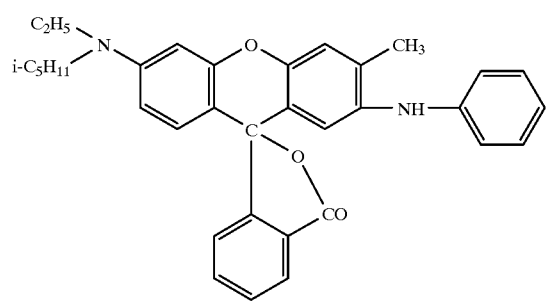
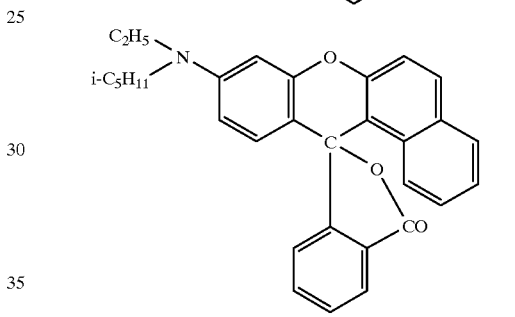
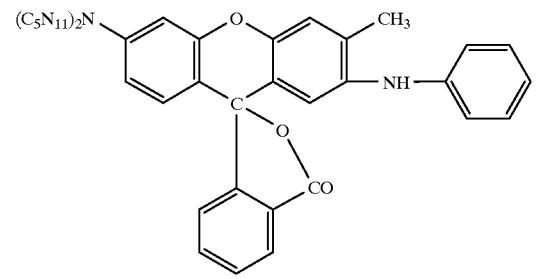
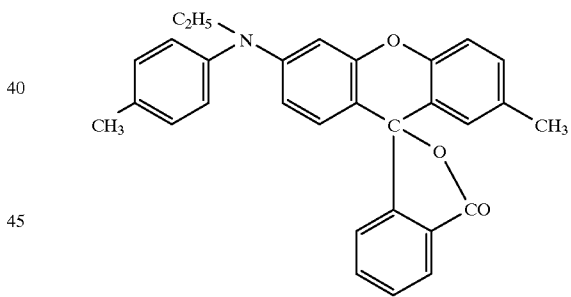
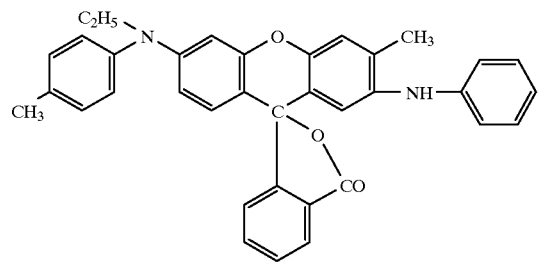
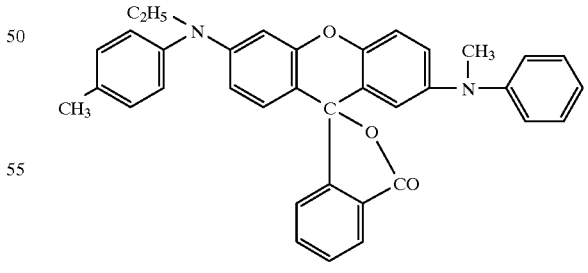

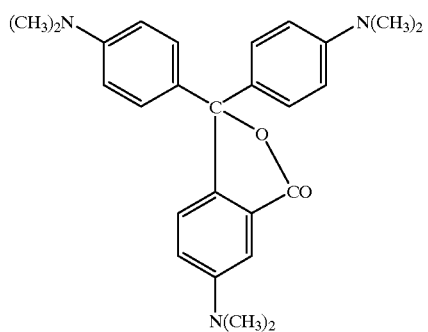
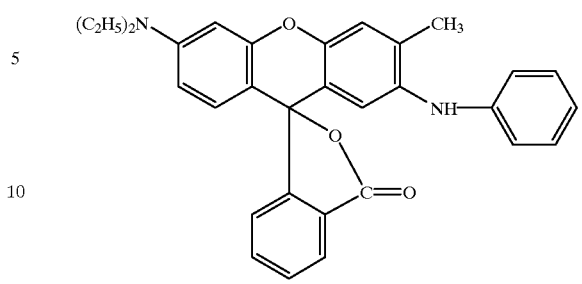
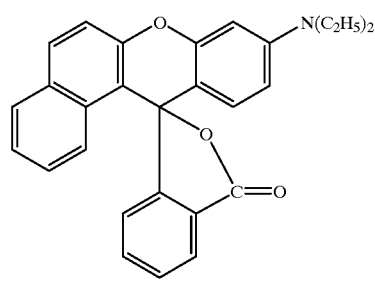
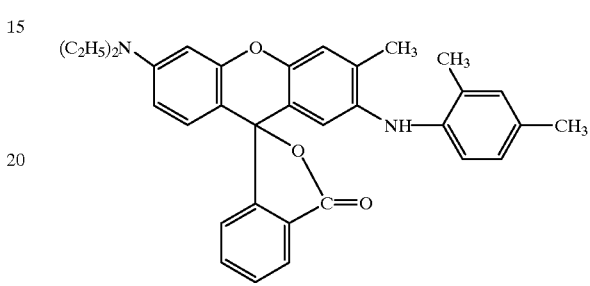
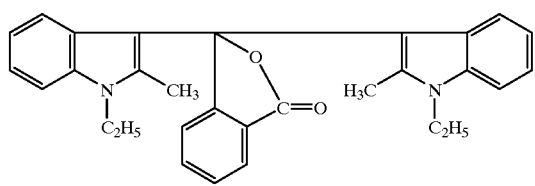
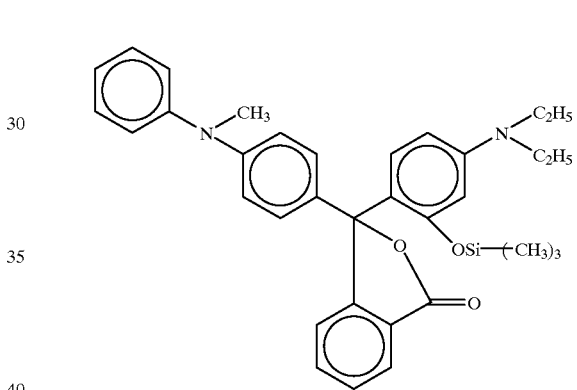
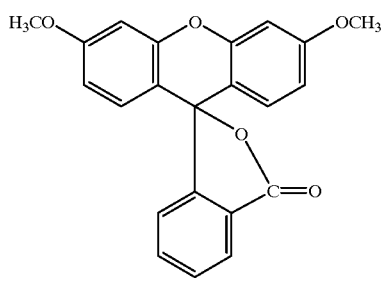
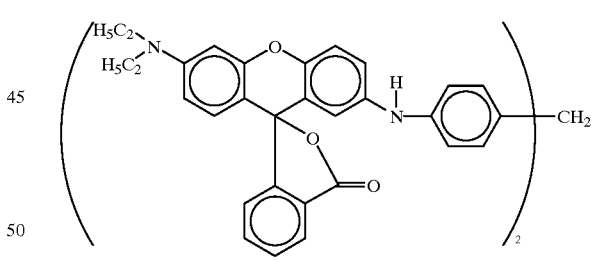
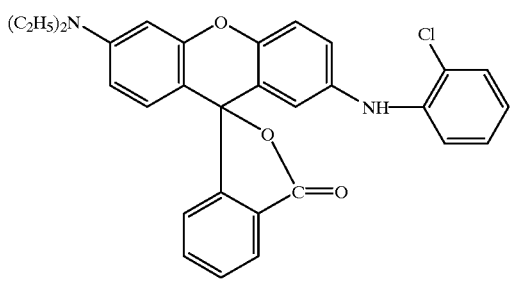

|     | $X^d$ | $X^c$ | $X^e$ | $X^f$ |
|-----|-------|-------|-------|-------|
| L66 | H | H | cyclohexyl / H | $CH_3$ |
| L67 | H | —$CH_3$ | " | " |
| L68 | $CH_3$ | H | " | " |
| L69 | $CH_3$ | $CH_3$ | " | " |
| L70 | H | $CH_3$ | $CH_3$ | $CH_3$ |

|     | $X^a$ | $X^b$ |
|-----|-------|-------|
| L74 | OCCH$_3$ (‖O) | H |
| L75 | OH | H |
| L76 | OH | —$CH_3$ |

-continued
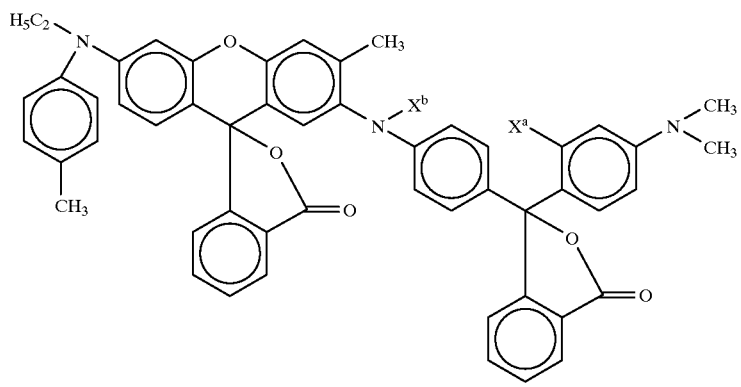
| | $X^a$ | $X^b$ |
|---|---|---|
| 77 | OCCH₃ (C=O) | H |
| 78 | OH | CH₃ |
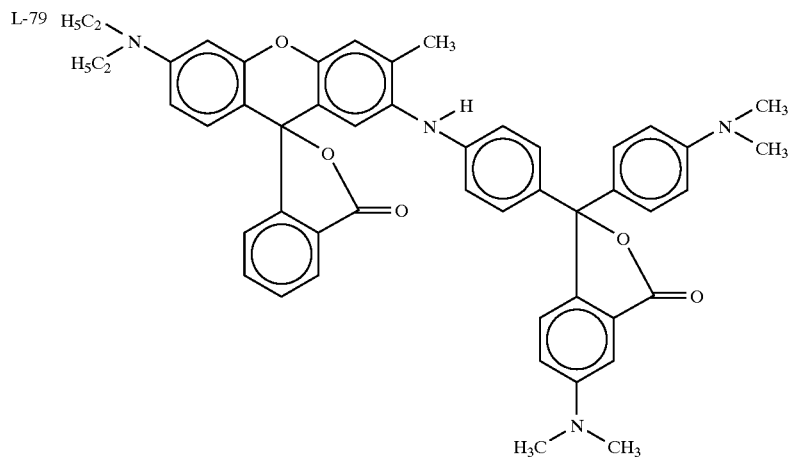
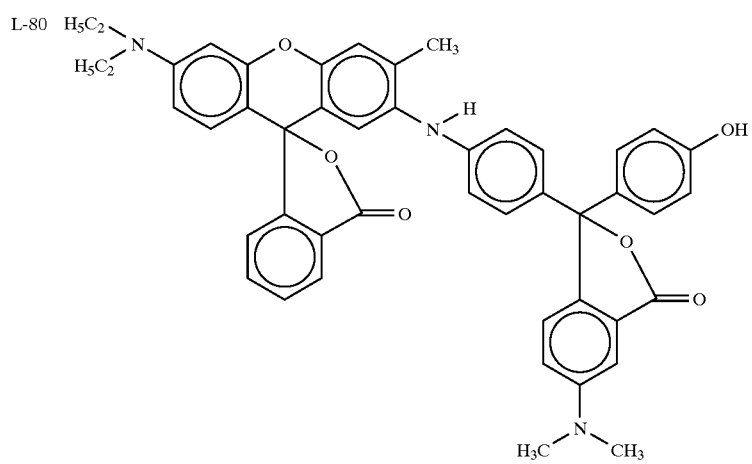

-continued
L-81 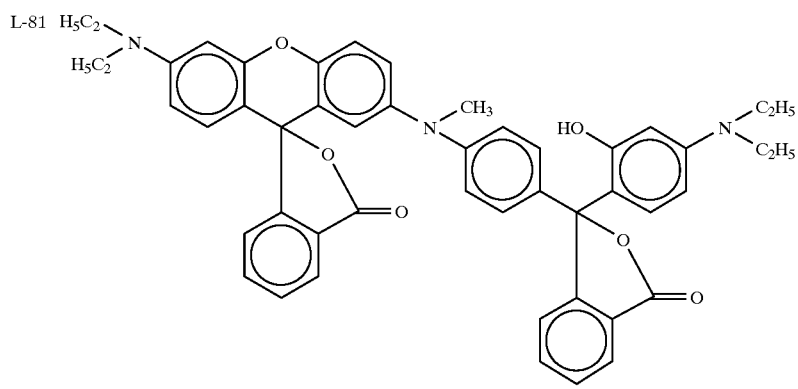
L-83 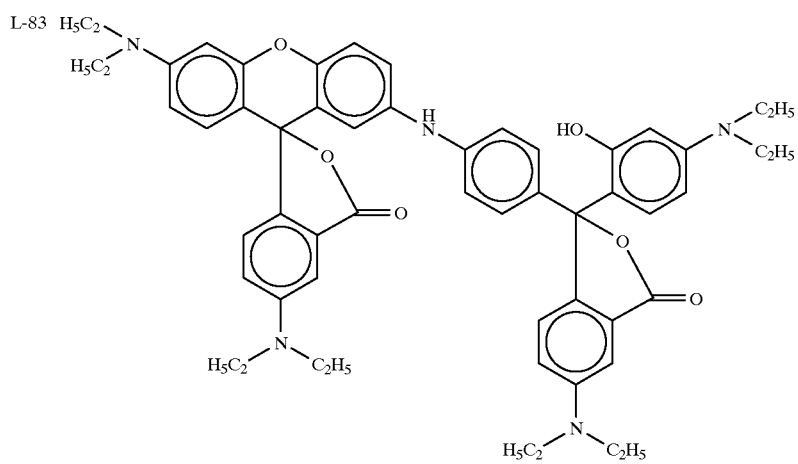
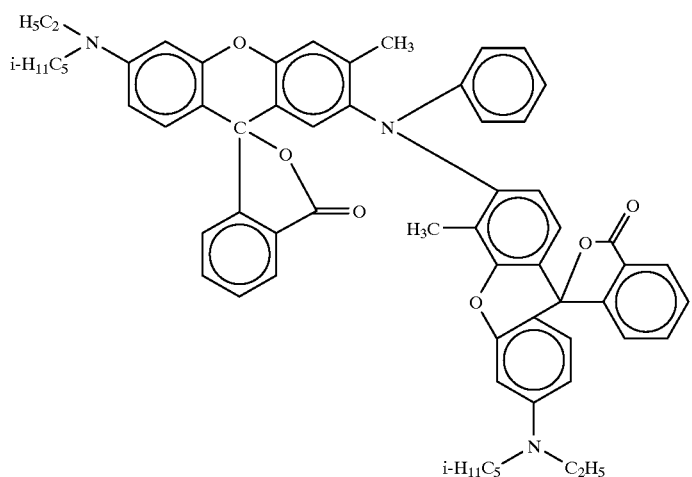
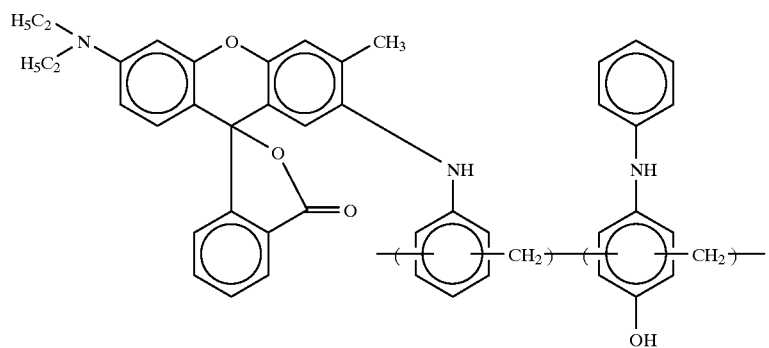
1:1 molar ratio

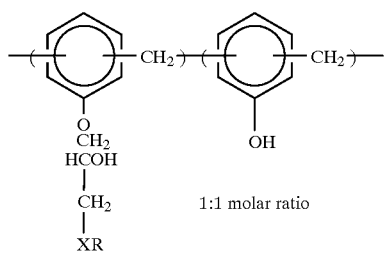
1:1 molar ratio
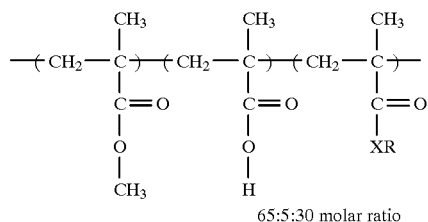
65:5:30 molar ratio
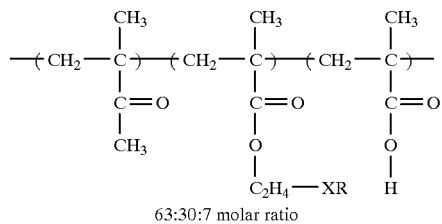
63:30:7 molar ratio
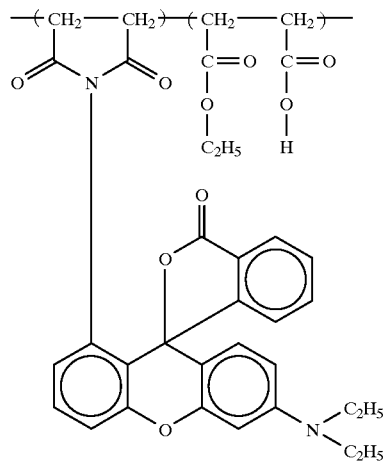
1:1 molar ratio
wherein XR is
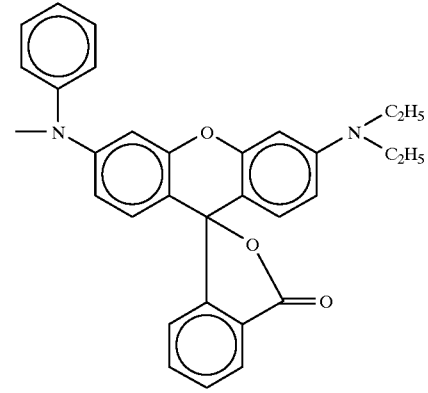
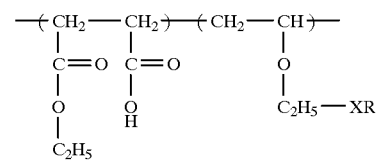
30:70 molar ratio
wherein XR is
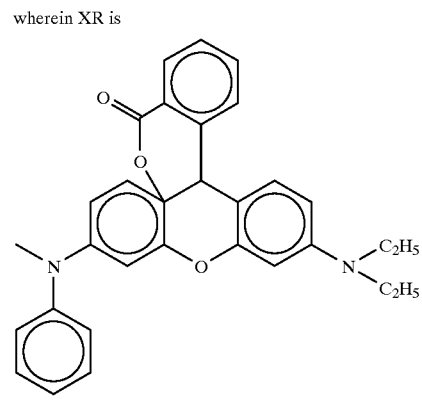

-continued
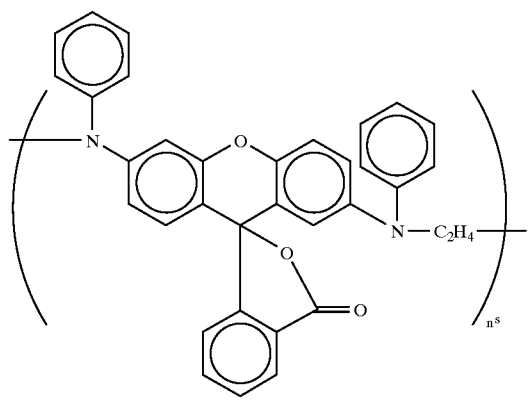
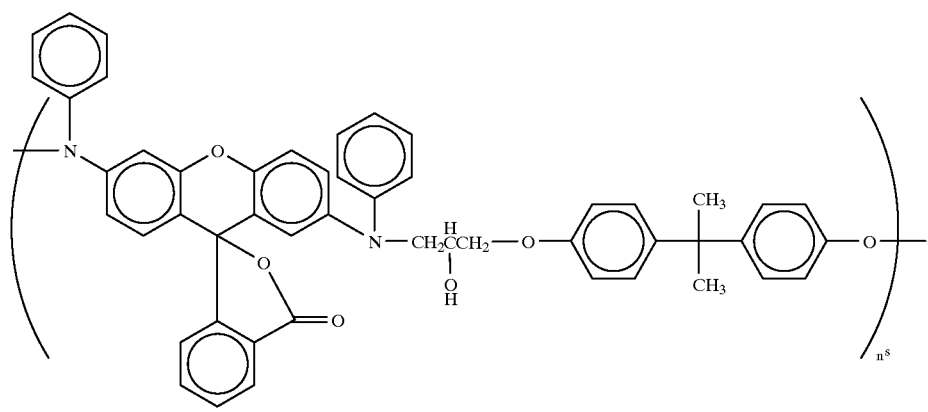
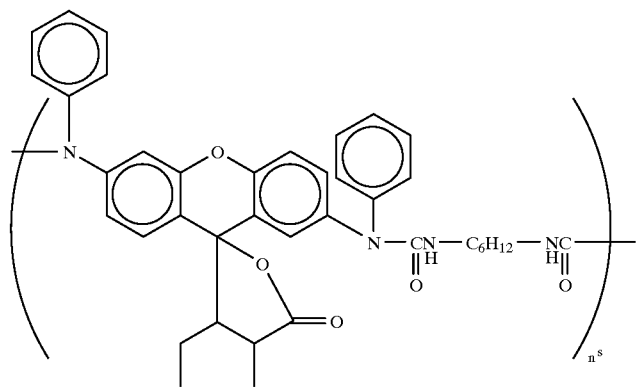
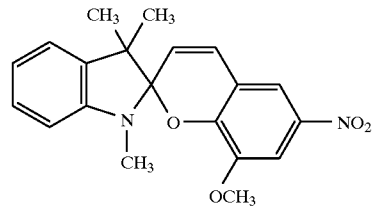
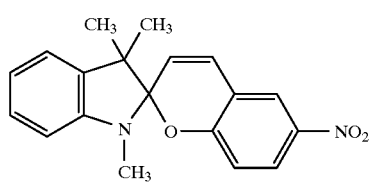
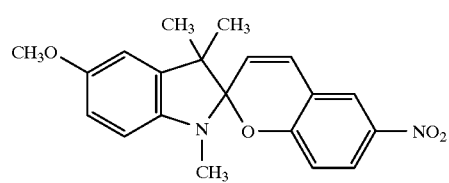
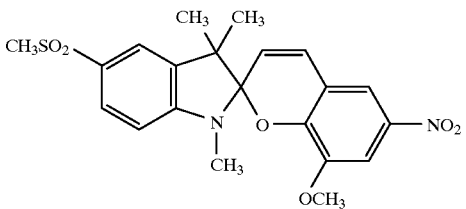
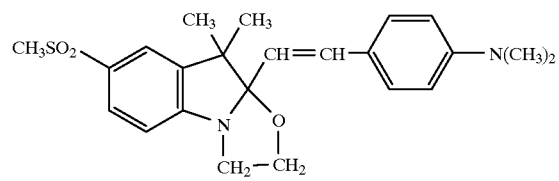

-continued

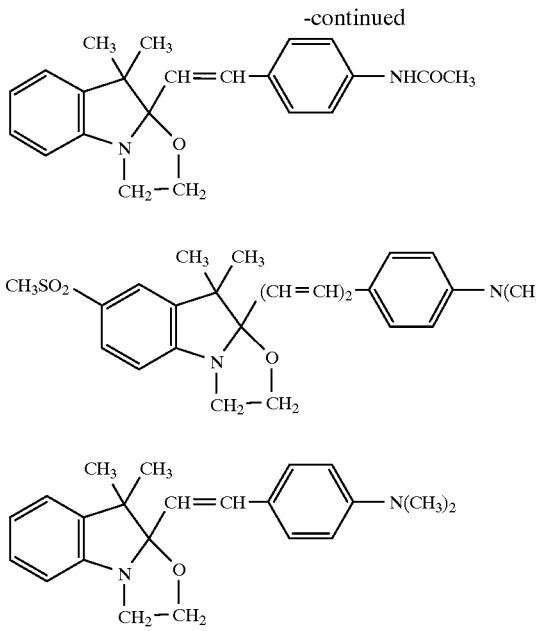
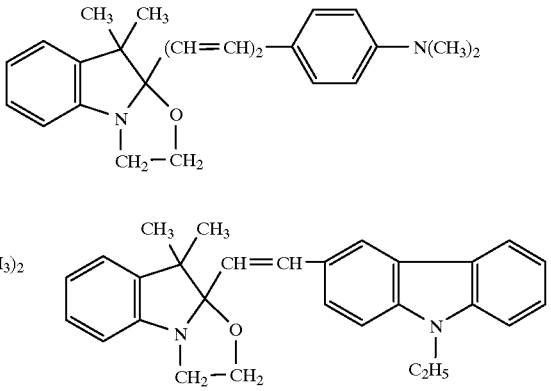

Now, the proportions of the components of the photosensitive composition of the present invention will be described. The blend ratio of the alkali-soluble organic high molecular substance having phenolic hydroxyl groups, is usually from 2 to 98 wt %, preferably from 10 to 95 wt %, more preferably from 20 to 90 wt %, based on the total solid content in the photosensitive composition.

The blend ratio of the acid color forming dye of the present invention is usually from 1 to 98 wt %, preferably from 3 to 80 wt %, more preferably from 5 to 70 wt %, based on the total solid content in the photosensitive composition, in a case where the acid color forming dye is an organic polymer (usually, weight average molecular weight Mw=1,000 to 100,000), and it is usually from 1 to 50 wt %, preferably from 3 to 40 wt %, more preferably from 5 to 30 wt %, based on the total solid content in the photosensitive composition, in a case where the dye is not an organic polymer.

With the positive photosensitive composition of the present invention, upon irradiation, the alkali-soluble organic high molecular substance, the acid color forming dye or the proton transfer complex in the composition, absorbs light, and the above mentioned proton transfer complex structure and a matrix structure of the alkali-soluble organic high molecular substance with the proton transfer complex as the center, will be destroyed by a photochemical reaction or by an action of heat generated by light absorption, whereby the solubility in the aqueous alkali solution of the irradiated portion is remarkably improved, and it is possible to obtain a positive image having a high contrast. Further, it is also possible to incorporate a photo-thermal conversion material to the positive photosensitive composition for the purpose of increasing the above mentioned effect for improving the solubility by such a photochemical reaction or by heat generated by light absorption.

The photo-thermal conversion material to be used for the positive photosensitive composition of the present invention is not particularly limited so long as it is a material capable of generating heat when irradiated with light. More specifically, it may, for example, be a near infrared absorbing dye, an organic or inorganic pigment, or a metal, having an absorption band covering a part or whole of a wavelength region of from 650 to 1,300 nm. Specifically, carbon black; graphite; a metal such as titanium or chromium; a metal oxide such as titanium oxide, tin oxide, zinc oxide, vanadium oxide or tungsten oxide; a metal carbide such as titanium carbide; a metal borate; and an inorganic black pigment, an azo type black pigment, "lionol green 2YS", or a black or green organic pigment such as "green pigment 7", as disclosed in JP-A-4-322219, may, for example, be mentioned. As the above carbon black, "MA-7", "MA-100", "MA-220", "#5", "#10" and "#40", as commercial products of Mitsubishi Chemical Corporation, and "color black FW2", "FW20" and "printex V", as commercial products of Degussa Company, may, for example, be mentioned.

Further, dyes having absorption in a near infrared region, as disclosed in e.g. "Special Function Dye" (compiled by Ikemori and Chuya, 1986, published by Kabushiki Kaisha CMC), "Chemistry of Functional Dyes" (compiled by Higaki, 1981, published by Kabushiki Kaisha CMC), "Dye Handbook" (compiled by Oga, Hirashima, Matsuoka and Kitao, publishied by Kodansha), the catalogue published in 1995 by Japan Photosensitive Research Institute, and a laser dye catalogue published in 1989 by Exciton Inc., may be mentioned.

Further, organic dyes disclosed in JP-A-2-2074, JP-A-2-2075, JP-A-2-2076, JP-A-3-97590, JP-A-3-97591, JP-A-3-63185, JP-A-3-26593 and JP-A-3-97589, and commercial product "IR820B" of Nippon Kayaku K.K., may, for example, be mentioned. As the photo-thermal conversion material, typical examples of dyes and pigments having absorption in a near infrared region will be shown below.

S-1
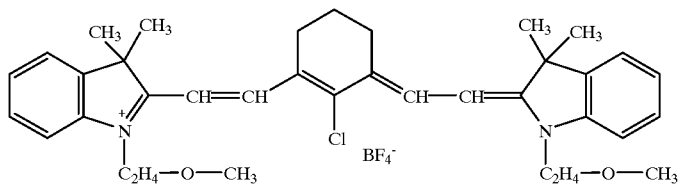
S-2
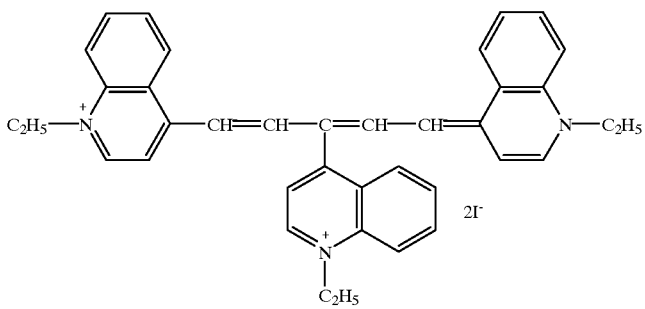
S-3
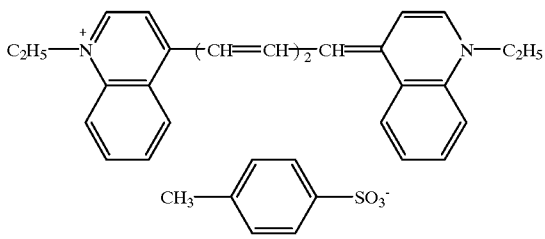
S-4
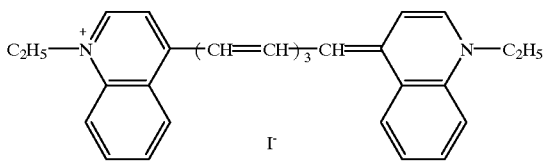
S-5
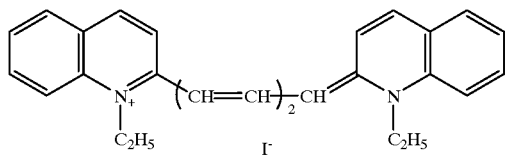
S-6
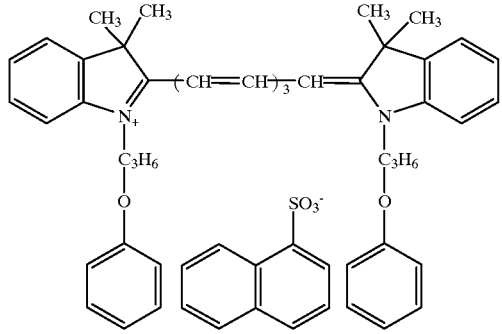

S-7
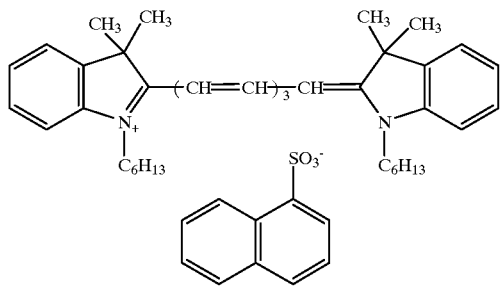
S-8
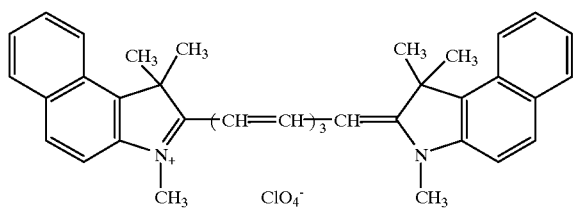
S-9
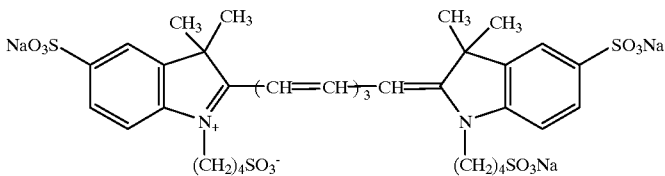
S-10
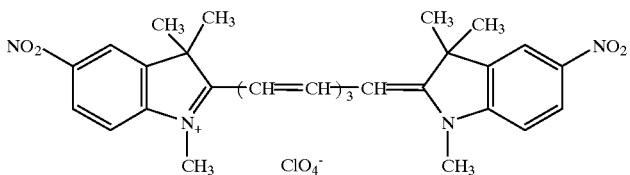
S-11
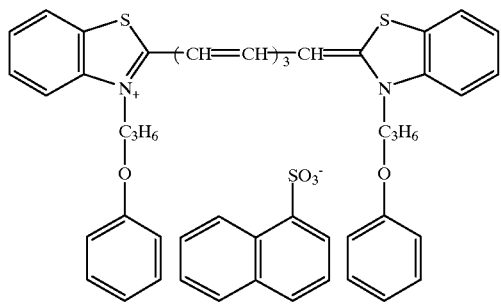
S-12
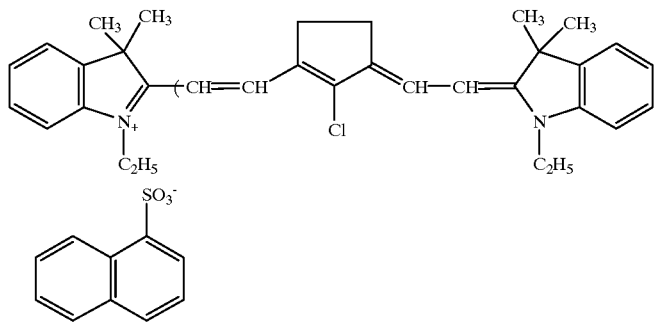

-continued
S-13
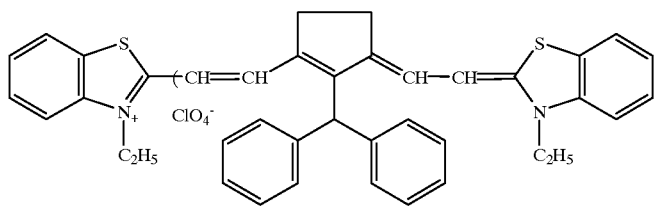
S-14
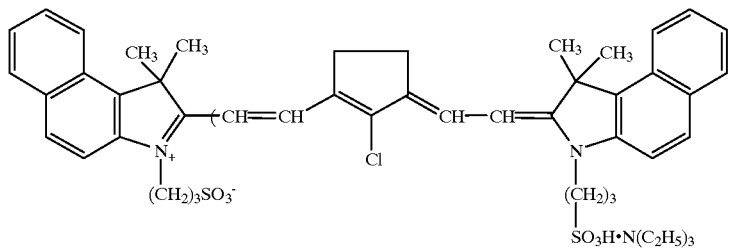
S-15
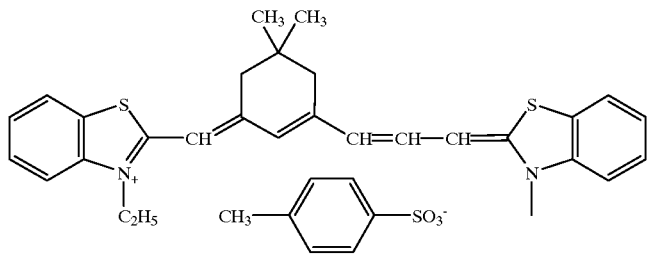
S-16
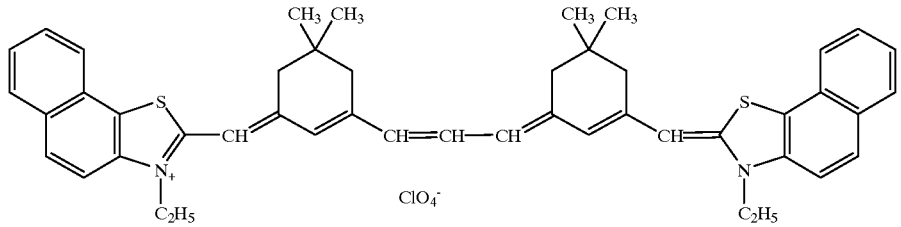
S-17
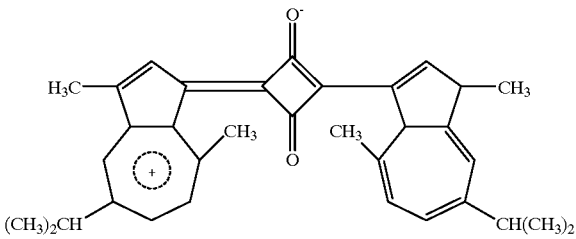
S-18
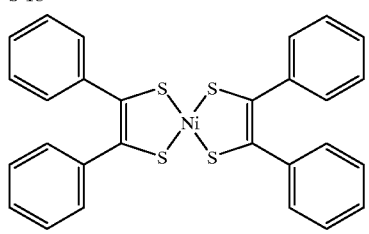

-continued
S-19
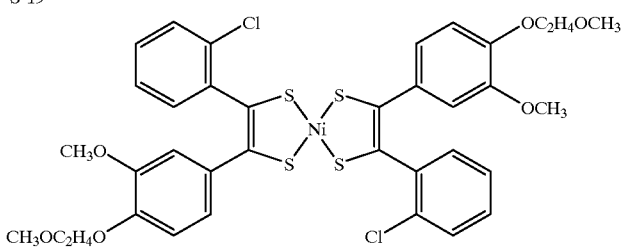
S-20
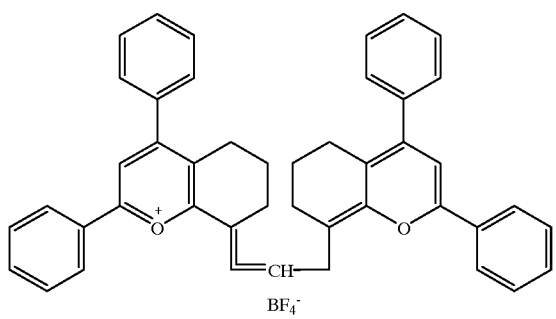
S-21
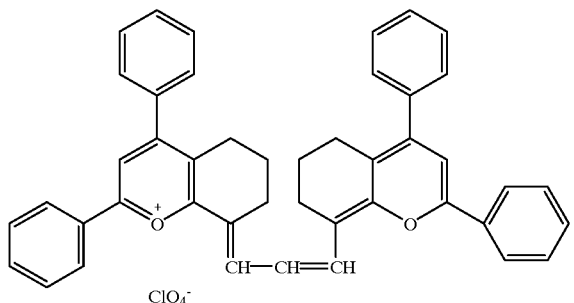
S-22
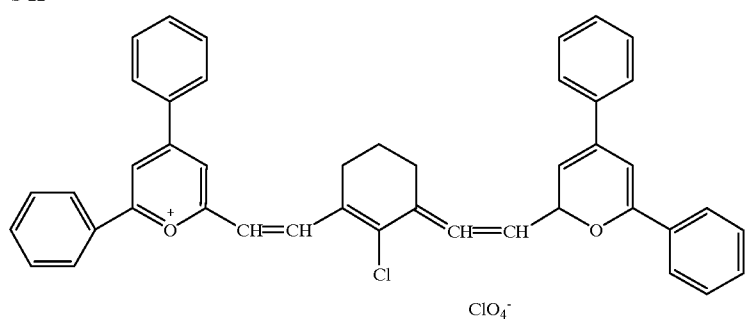
S-23
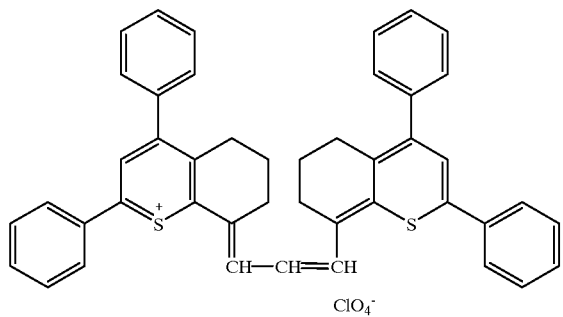

-continued
S-24
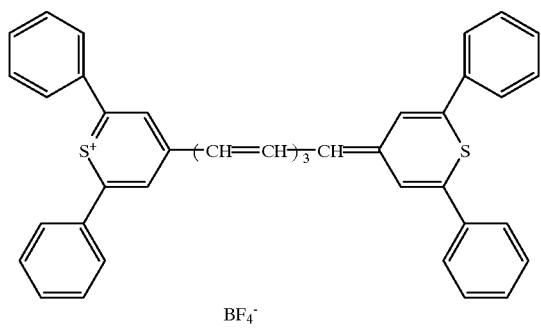
S-25
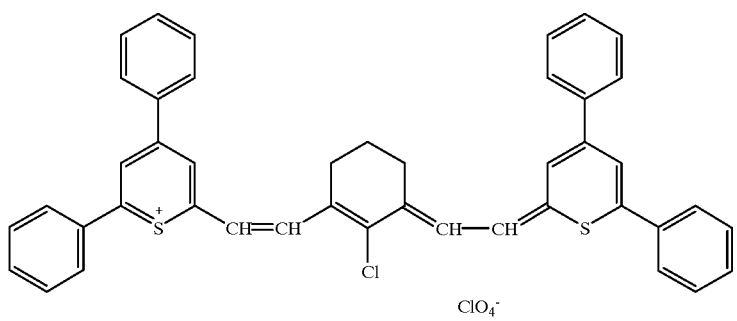
S-26
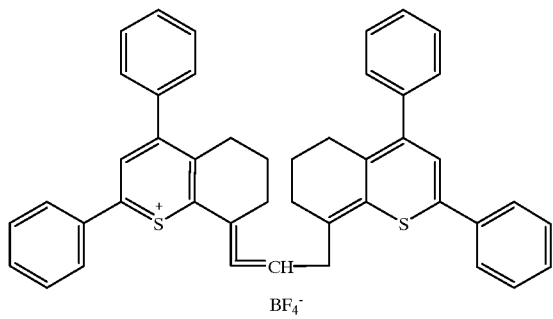
S-27
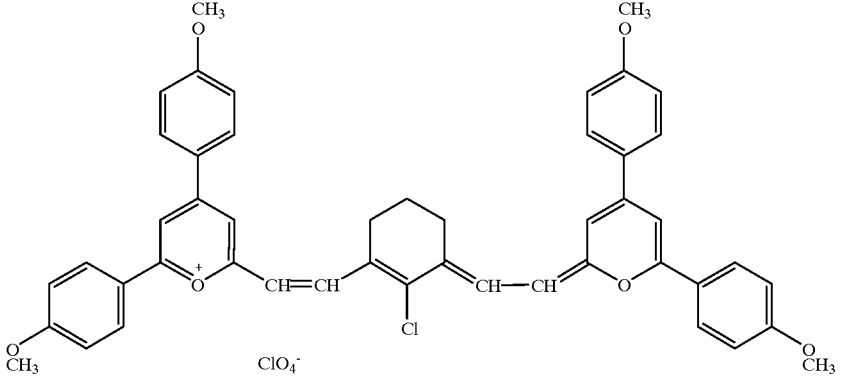

-continued
S-28
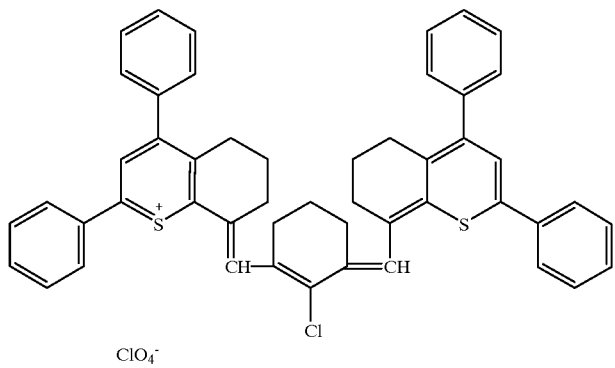
S-29
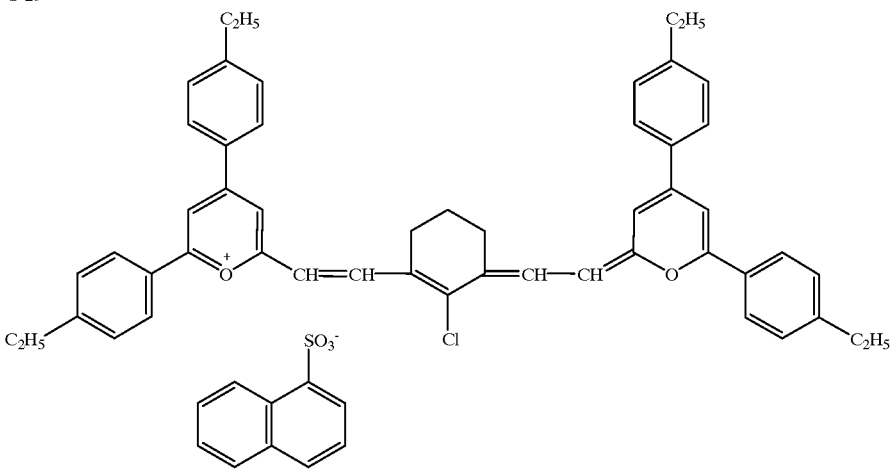
S-30
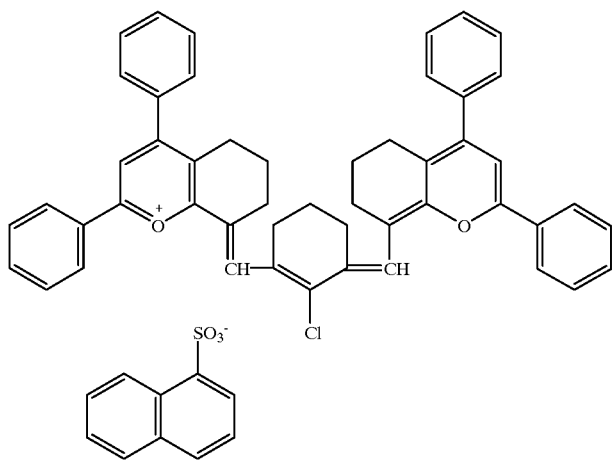
S-31
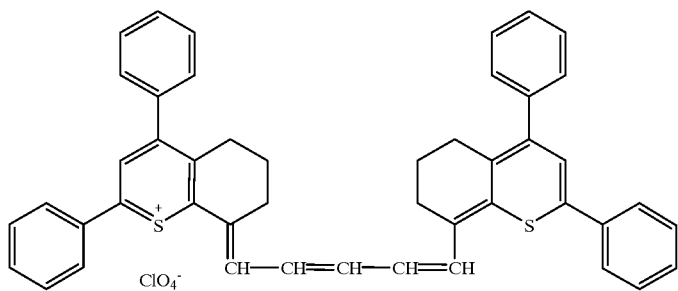

S-32
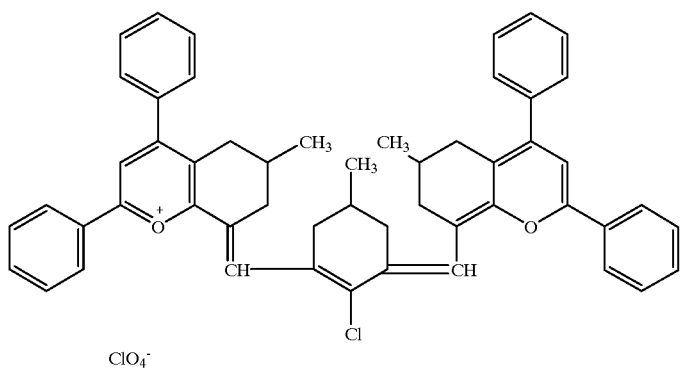
ClO4-
S-33
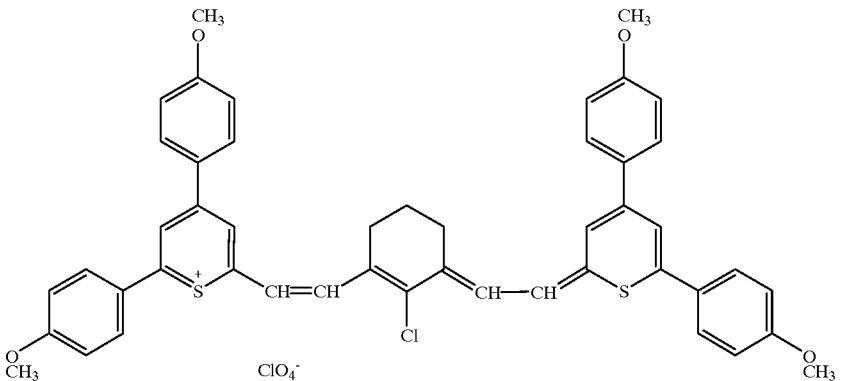
ClO4-
S-34
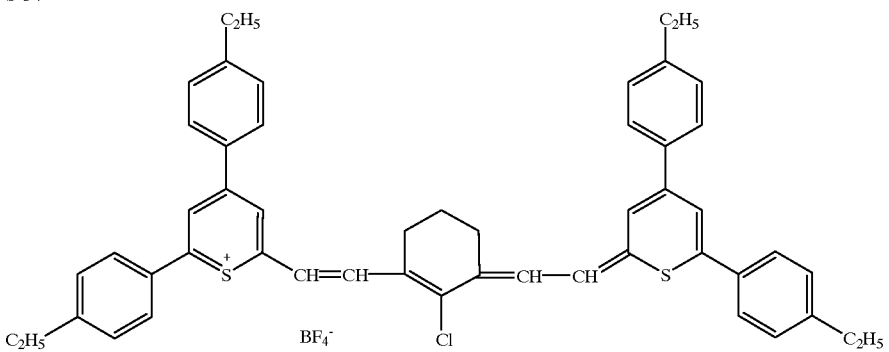
BF4-
S-35
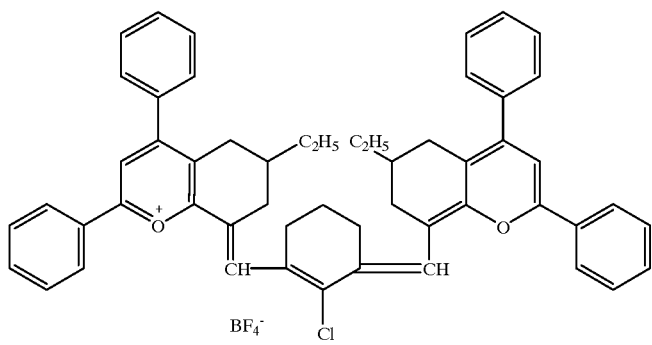
BF4-

S-36
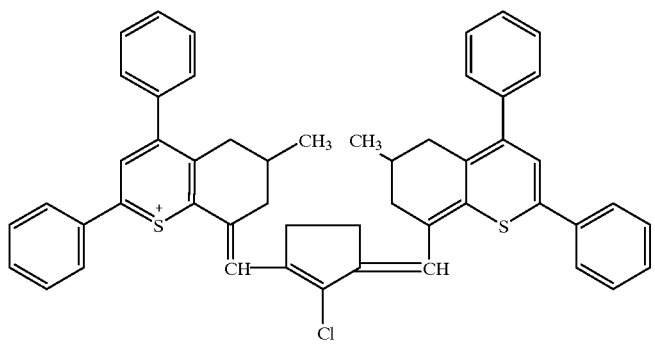
S-37
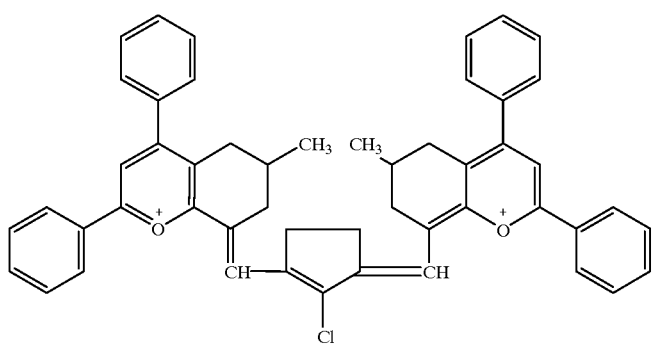
S-38
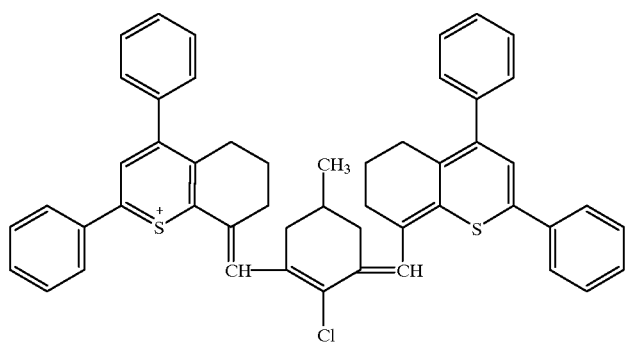
S-39
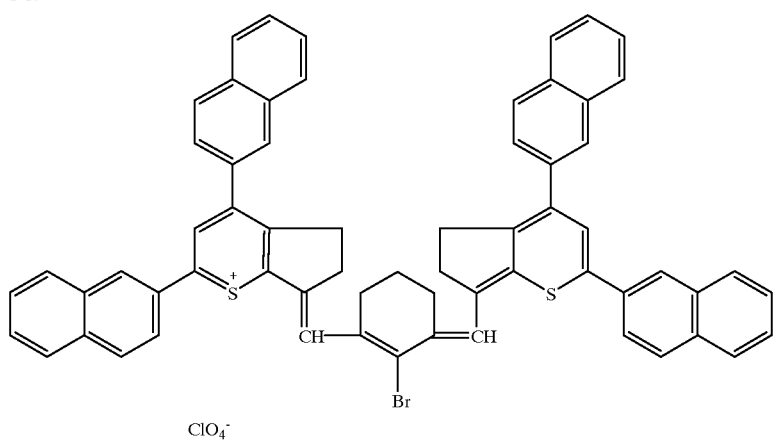

-continued
S-40
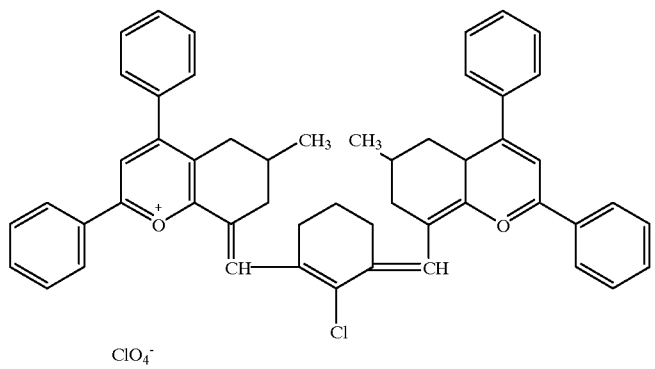
ClO4-
S-41
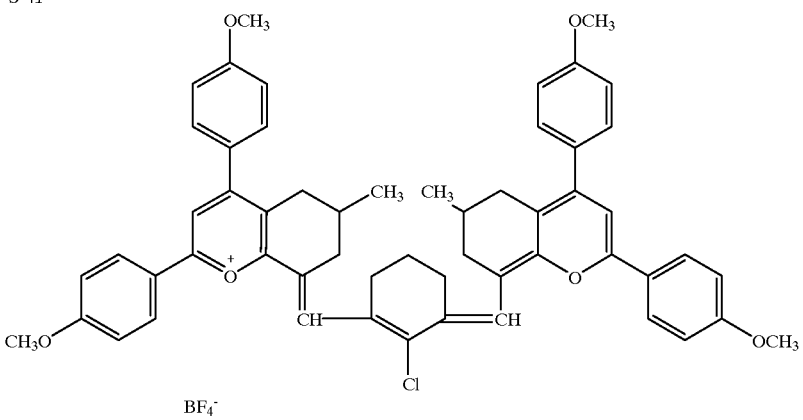
BF4-
S-42
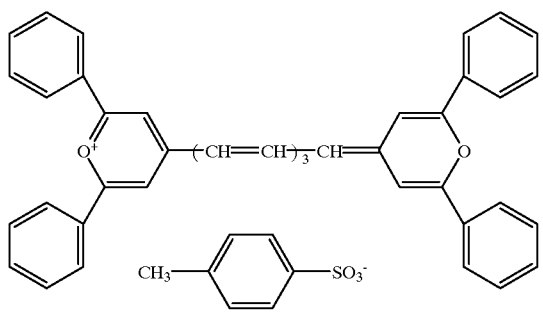
S-43
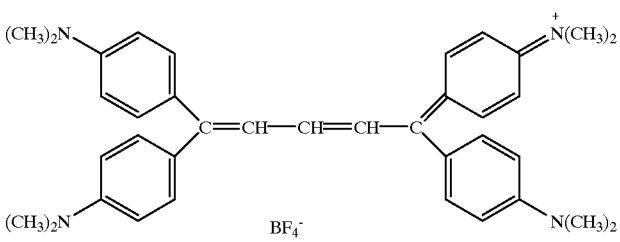
BF4-
S-44
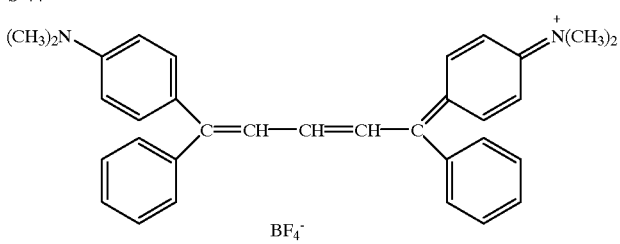
BF4-

S-45
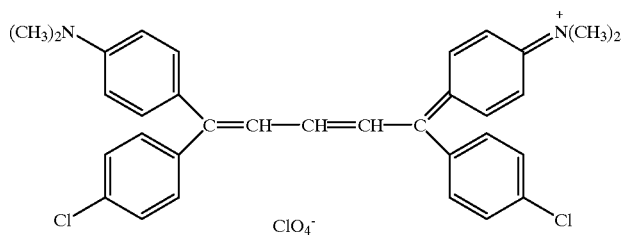
S-46
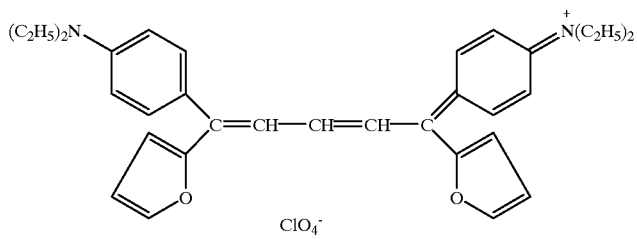
S-47
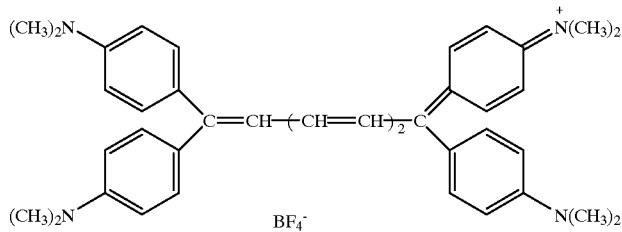
S-48
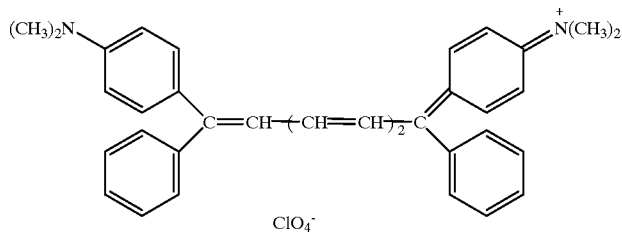
S-49
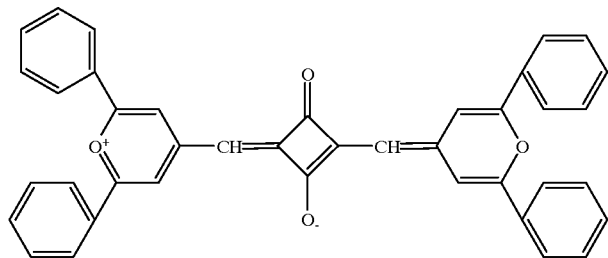
S-50
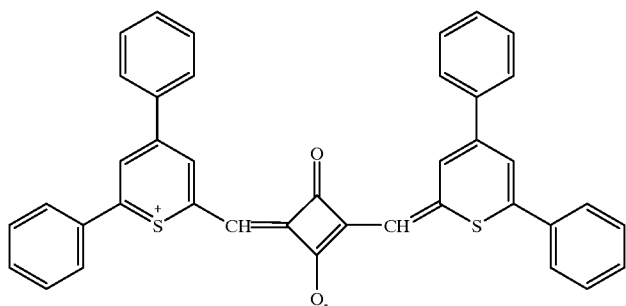

-continued
S-51
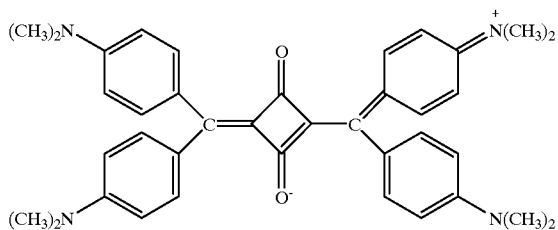
S-52
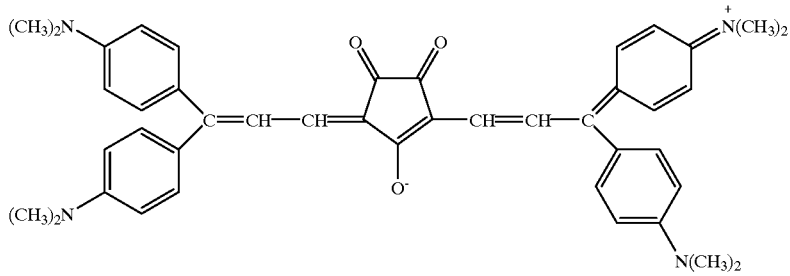
S-53
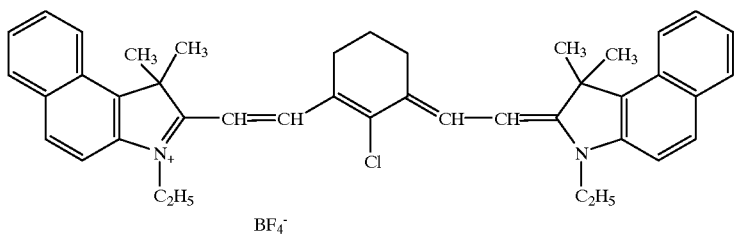
S-54
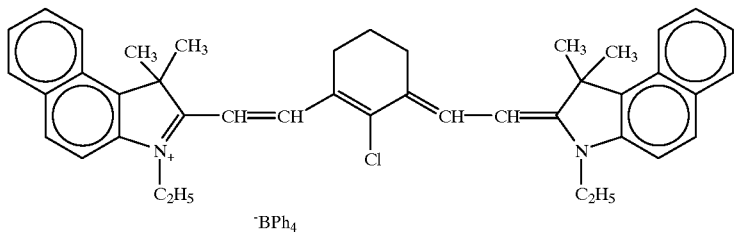
S-55
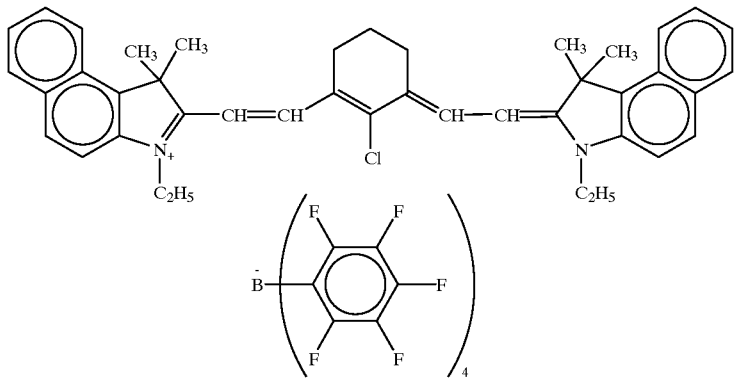

S-56

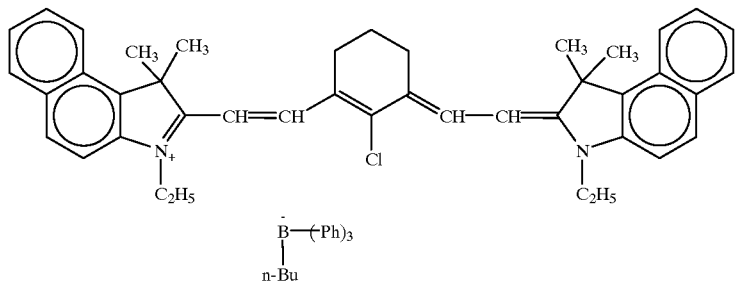

S-57

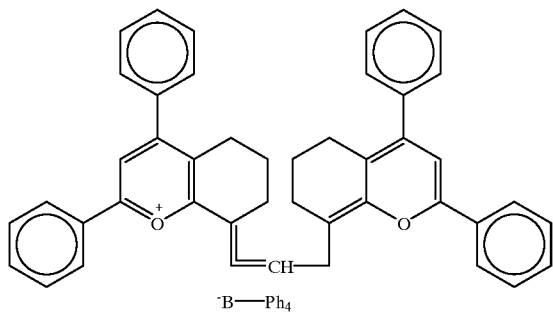

S-58

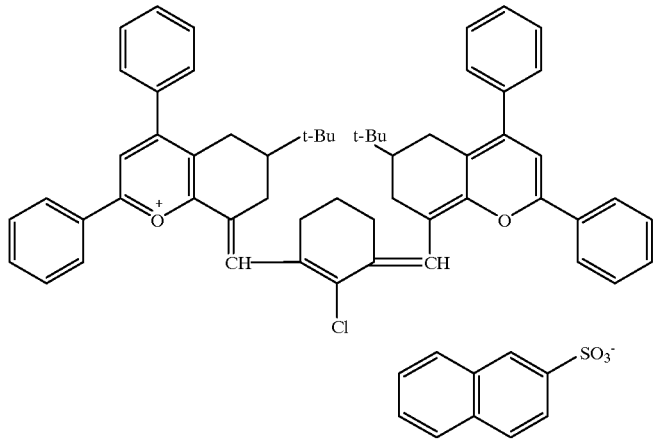

These dyes can be synthesized in accordance with conventional methods.

S-59 polymethine dye: IR-820B (manufactured by Nippon Kayaku K.K.)
S-60 nigrosine dye: Colour Index Solvent Black 5
S-61 nigrosine dye: Colour Index Solvent Black 7
S-62 nigrosine dye: Colour Index Acid Black 2
S-63 carbon black: MA-100 (manufactured by Mitsubishi Chemical corporation)
S-64 titanium monoxide: Titanium Black 13M (manufactured by Mitsubishi Material K.K.)
S-65 titanium monoxide: Titanium Black 12S (manufactured by Mitsubishi Material K.K.)

Among these, a cyanine dye, a polymethine dye, a squarilium dye, a croconium dye, a pyrylium dye and a thiopyrylium dye are preferred. Further, a cyanine dye, a polymethine dye, a pyrylium dye and a thiopyrylium dye are more preferred.

Among these, particularly preferred is a cyanine dye of the following formula (I) or a polymethine dye of the formula (II) in a wavelength region of from 650 to 900 nm, and a pyrylium dye or a thiopyrylium dye of the following formula (III) in a wavelength region of from 800 to 1300 nm:

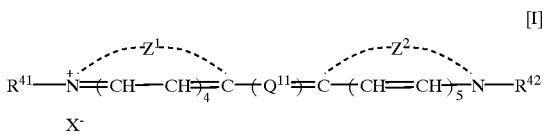

[I]

wherein each of $R^{41}$ and $R^{42}$ is a $C_{1-8}$ alkyl group which may have a substituent, wherein the substituent is a phenyl group, phenoxy group, an alkoxy group, a sulfuric acid group, or a carboxyl group; $Q^{11}$ is a heptamethine group which may have a substituent, wherein the substituent is a $C_{1-8}$ alkyl group, a halogen atom or an amino group, or the heptamethine group may contain a cyclohexene ring or a cyclopentene ring having a substituent, formed by mutual bonding of substituents on two methine carbon atoms of the heptamethine group, wherein the substituent is a $C_{1-6}$ alkyl group or a halogen atom; each of $m^4$ and $m^5$ is 0 or 1; each of $Z^1$ and $Z^2$ is a group of atoms required for forming a nitrogen-containing heterocyclic ring; and $X^-$ is a counter anion.

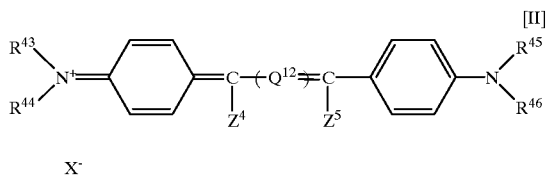

[II]

wherein each of $R^{43}$ and $R^{46}$ is a $C_{1-8}$ alkyl group; each of $Z^4$ and $Z^5$ is an aryl group which may have a substituent, wherein the aryl group is a phenyl group, a naphthyl group, a furyl group or a thienyl group, and the substituent is a $C_{1-4}$ alkyl group, a $C_{1-8}$ dialkylamino group, a $C_{1-8}$ alkoxy group and a halogen atom; $Q^{12}$ is a trimethine group or a pentamethine group; and $X^-$ is a counter anion.

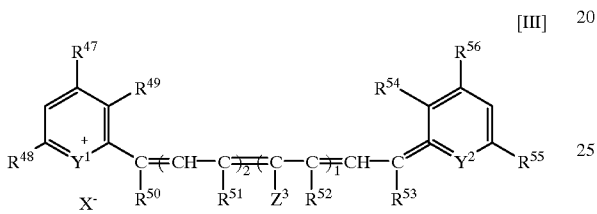

[III]

wherein each of $Y^1$ and $Y^2$ is an oxygen atom or a sulfur atom, each of $R^{47}$, $R^{48}$, $R^{55}$ and $R^{56}$ is a phenyl group or a naphthyl group which may have a substituent, wherein the substituent is a $C_{1-8}$ alkyl group or a $C_{1-8}$ alkoxy group; each of $l^1$ and $l^2$ which are independent of each other, is 0 or 1; each of $R^{49}$ and $R^{54}$ is a hydrogen atom or a $C_{1-8}$ alkyl group, or $R^{49}$ and $R^{50}$, $R^{51}$ and $R^{52}$, or $R^{53}$ and $R^{54}$, are bonded to each other to from a linking group of the formula:

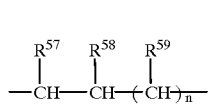

[IV]

wherein each of $R^{57}$ and $R^{59}$ is a hydrogen atom or a $C_{1-6}$ alkyl group, and n is 0 or 1,; $Z^3$ is a halogen atom or a hydrogen atom; and $X^-$ is a counter anion.

The counter anion $X^-$ in each of the above formulas (I), (II) and (III) may, for example, be an inorganic acid anion such as $Cl^-$, $Br^-$, $I^-$, $ClO_4^-$, $BF_4^-$ or $PF_6^-$, or an organic acid anion such as a benzenesulfonic acid, p-toluenesulfonic acid, naphtahlene-1-sulfonic acid or acetic acid.

Especially, a dye having an organic boric acid anion as a counter anion, is excellent in the solubility in the solvent for coating, whereby preparation of a coating solution can be facilitated, and a solvent having a low boiling point can be used. Accordingly, it is possible to prevent sticking of a non-dried photosensitive layer to e.g. coating line rollers, whereby high speed coating is made possible, and high productivity can be obtained.

When such a photo-thermal conversion material is incorporated to the photosensitive composition of the present invention, the blend ratio based on the total solid content in the photosensitive composition is usually from 0.5 to 30 wt %, preferably from 1 to 20 wt %, more preferably from 2 to 15 wt %.

Specifically, as such an organic borate acid anion, one represented by the following formula (L) may be mentioned.

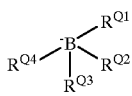

(L)

wherein each of $R^{Q1}$ to $R^{Q4}$ is a hydrogen atom, a $C_{1-15}$ alkyl group, a $C_{6-15}$ aromatic hydrocarbon group which may have a substituent, or a $C_{4-15}$ heterocyclic group which may have a substituent.

More specifically, each of $R^{Q1}$ to $R^{Q4}$ may be $—CH_3$, $—C_2H_5$, $—C_3H_7$, $—C_4H_9$, $—C_4H_9$-t,

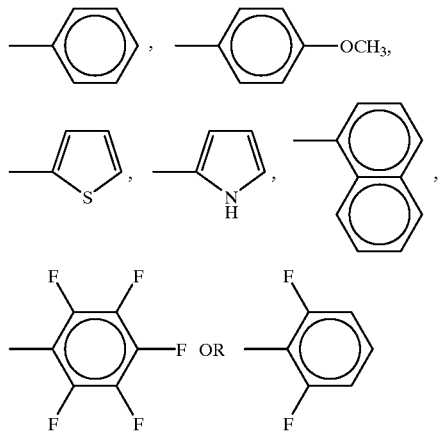

Further, the positive photosensitive composition (the photosensitive layer of the positive photosensitive material) of the present invention is preferably one which undergoes substantially no significant change to the solubility in an alkali developer even when it is left to stand for 10 hours under irradiation with a light intensity of 40 lux under a white fluorescent lamp (36 W white fluorescent lamp Neolumisuper FLR40S-W/M/36, manufactured by Mitsubishi Electric Company Ltd.), since it is useful under white light. Here, "undergoes substantially no significant change in the solubility" means that the change in the film thickness of an image obtained by exposure and development under a condition to form 3% halftone dots, is within 10% as between before and after the printing plate having a layer made of the positive photosensitive composition of the present invention, formed on a support, is left to stand for 10 hours.

Further, in the photosensitive layer, a coloring material other than the photo-thermal conversion material may be incorporated as the case requires. As the coloring material, a pigment or a dyestuff may be used. For example, Victoria Pure Blue (42595), Auramine (41000), Cation Briliant Flavin (basic 13), Rhodamine 6GCP (45160), Rhodamine B (45170), Safranine OK70: 100(50240), Erio GX (42080), Fast Black HB (26150), No. 120/Lionol Yellow (21090), Lionol Yellow GRO (21090), Similor First Yellow 8GF (21105), Benzidine Yellow 4T-564D (21095), Shimiloor First Red 4015 (12355), Lionol Red B4401 (15850), Fast Gen Blue TGR-L (74160), or Lionol Blue SM (26150), may be mentioned. The numerals in the above brackets ( ) indicate the color index (C.I.).

When such a coloring material is incorporated, its blend ratio is usually from 1 to 50 wt %, preferably from 2 to 30 wt %, based on the solid content of the entire photosensitive layer composition.

The photosensitive composition of the present invention is prepared usually by dissolving the above described various components in a suitable solvent. The solvent is not particularly limited so long as it is a solvent which presents an excellent coating film property and provides sufficient solubility for the components used. It may, for example, be a cellosolve solvent such as methylcellosolve, ethylcellosolve, methylcellosolve acetate or ethylcellosolve acetate, a propylene glycol solvent such as propylene glycol monomethyl ether, propylene glycol monoethyl ether, propylene glycol monobutyl ether, propylene glycol monomethyl ether acetate, propylene glycol monoethyl ether acetate, propylene glycol monobutyl ether acetate or dipropylene glycol dimethyl ether, an ester solvent such as butyl acetate, amyl acetate, ethyl butyrate, butyl butylate, diethyl oxalate, ethyl pyruvate, methyl-2-hydroxy butyrate, ethyl acetate, methyl lactate, ethyl lactate or methyl 3-methoxypropionate, an alcohol solvent such as heptanol, hexanol, diacetone alcohol or furfuryl alcohol, a ketone solvent such as cyclohexanone or methyl amyl ketone, a highly polar solvent such as dimethyl formamide, dimethyl acetamide or n-methyl pyrrolidone, or a solvent mixture thereof, or the one having an aromatic hydrocarbon added thereto. The proportion of the solvent is usually within a range of from 1 to 20 times in a weight ratio to the total amount of the photosensitive composition.

The photosensitive composition of the present invention may contain various additives, such as a coating property-improving agent, a development-improving agent, an adhesion-improving agent, a sensitivity-improving agent, an oleophilic agent, etc. within a range not to impair the performance of the composition.

The photosensitive composition of the present invention may be coated on a support and advantageously used as a photosensitive lithographic printing plate. As a method for coating the photosensitive composition on the surface of a support, a conventional method such as rotational coating, wire bar coating, dip coating, air knife coating, roll coating, blade coating or curtain coating may, for example, be employed. The temperature for drying or heating is, for example, from 20 to 170° C., preferably from 30 to 150° C.

The thickness of the photosensitive layer is usually from 0.3 to 7 $\mu$m, preferably from 0.5 to 5 $\mu$m, more preferably from 1.0 to 3 $\mu$m. The support on which a photosensitive layer made of the photosensitive composition of the present invention will be formed, may, for example, be a metal plate of e.g. aluminum, zinc, steel or copper, a metal plate having chromium, zinc, copper, nickel, aluminum, iron or the like plated or vapor-deposited thereon, a paper sheet, a plastic film, a glass sheet, a resin-coated paper sheet, a paper sheet having a metal foil such as an aluminum foil bonded thereto, or a plastic film having hydrophilic treatment applied thereto. As the support for a photosensitive lithographic printing plate of the present invention, it is particularly preferred to employ an aluminum plate having grain treatment applied by brush polishing or electrolytic etching in a hydrochloric acid or nitric acid solution, having anodizing treatment applied in a sulfuric acid solvent and, if necessary, having surface treatment such as pore sealing treatment applied.

The roughness of the surface of the support is usually represented by the surface roughness Ra. This surface roughness can be measured by using a surface roughness meter. The support to be used in the present invention is preferably an aluminum plate having an average roughness Ra of from 0.3 to 1.0 $\mu$m, more preferably from 0.4 to 0.8 $\mu$m.

The support may further be subjected to surface treatment with an organic acid compound, as the case requires, before use.

The light source for image exposure of the photosensitive composition of the present invention may be a light source of a lamp such as a xenon lamp, a high pressure mercury lamp, a low pressure mercury lamp, a halogen lamp or a metal halide lamp, or a light source of a laser such as a HeNe laser, an argon laser, a YAG laser, a HeCd laser, a semiconductor laser or a ruby laser. Especially when the photosensitive composition of the present invention contains a photothermal conversion material, and it is advantageously used for forming an image by heat generated upon absorption of light, preferred is a light source which generates a light beam of e.g. a near infrared laser of from 650 to 1,300 nm, such as a ruby laser, a YAG laser, a semiconductor laser, a LED or other solid laser, particularly preferably a semiconductor laser or a YAG laser, which is small in size and has a long useful life. With such a laser light source, scanning exposure is usually carried out, and then development is carried out with a developer to obtain an image.

The laser light source is used to scan the surface of a photosensitive material in the form of a high intensity light ray (beam) focused by a lens, and the sensitivity characteristic (mj/cm$^2$) of the positive lithographic printing plate of the present invention responding thereto may sometimes depend on the light intensity (mJ/S·cm$^2$) of the laser beam received at the surface of the photosensitive material. Here, the light intensity (mJ/S·cm$^2$) of the laser beam can be determined by measuring the energy per unit time (MJ/S) of the laser beam on the printing plate by a light power meter, measuring also the beam diameter (the irradiation area: cm$^2$) on the surface of the photosensitive material, and dividing the energy per unit time by the irradiation area. The irradiation area of the laser beam is usually defined by the area of the portion exceeding 1/e$^2$ intensity of the laser peak intensity, but it may simply be measured by sensitizing the photosensitive material shown reciprocity law.

The light intensity of the light source to be used in the present invention is preferably at least 2.0×10$^6$ mJ/s·cm$^2$, more preferably at least 1.0×10$^7$ mJ/s·cm$^2$. If the light intensity is within the above range, the sensitivity characteristic of the positive lithographic printing plate of the present invention can be improved, and the scanning exposure time can be shortened, such being practically very advantageous.

As the developer to be used for developing the photosensitive composition of the present invention, an alkali developer composed mainly of an aqueous alkali solution is preferred.

As the alkali developer, an aqueous solution of an alkali metal salt such as sodium hydroxide, potassium hydroxide, sodium carbonate, potassium carbonate, sodium metasilicate, potassium metasilicate, sodium secondary phosphate or sodium tertiary phosphate, may, for example, be mentioned. The concentration of the alkali metal salt is preferably from 0.1 to 20 wt %. Further, an anionic surfactant, a nonionic surfactant, an amphoteric surfactant or an organic solvent such as an alcohol, may be added to the developer, as the case requires.

Now, the present invention will be described in further detail with reference to Examples. However, it should be understood that the present invention is by no means restricted to such specific Examples.

Preparation of an Aluminum Plate

An aluminum plate (material: 1050, hardness: H16) having a thickness of 0.24 mm was subjected to degreasing treatment at 60° C. for one minute in a 5 wt % sodium hydroxide aqueous solution and then to electrolytic etching treatment in an aqueous hydrochloric acid solution having a concentration of 0.5 mol/l at a temperature of 28° C. at a current density of 60 A/dm² for a treating time of 40 seconds. Then, it was subjected to desmut treatment in a 4 wt % sodium hydroxide aqueous solution at 60° C. for 12 seconds and then to anodizing treatment in a 20 wt % sulfuric acid solution at a temperature of 20° C. at a current density of 3.5 A/dm² for a treating time of one minute. Further, it was subjected to a hydrothermal pore sealing treatment with hot water of 80° C. for 20 seconds to obtain an aluminum plate as a support for a lithographic printing plate. The value of average roughness Ra of this plate was 0.60 μm. This Ra alue was measured by means of a surface roughness meter Se-3DH (manufactured by Kosaka Kenkyusho K.K.) under such conditions that the scanning length was 4 mm, the high region cut off was nil, and the low region cut off was 0.8 mm.

Method for Measuring the Coating Amount of a Photosensitive Layer

A sample of a photosensitive lithographic printing plate obtained by coating, drying and heat-treating a photosensitive liquid on a substrate under the conditions as identified in each of the following Examples, was cut into a square specimen of 10 cm×10 cm, and the weight of the test specimen was measured. Then, the photosensitive layer was dissolved and removed by acetone, and the weight was again measured to obtain a reduction in weight. From the value of the reduction in weight, the coating amount was obtained as the weight per m².

Remaining Coating Ratio

The remaining coating amount of an image portion after development in the manner as disclosed in Examples and Comparative Examples, was determined in the same manner as described above, and the remaining coating ratio was obtained from the remaining coating amount as compared with the initial coating amount.

A: The Remaining coating is at least 90 wt % of the initial amount.

B: The remaining coating is at least 70 wt % and less than 90 wt % of the initial amount.

C: The remaining coating is at least 50 wt % and less than 70 wt % of the initial amount.

D: The remaining coating is less than 50 wt % of the initial amount.

The materials used in the following Examples and Comparative Examples and disclosed in the Tables, are identified as follows.

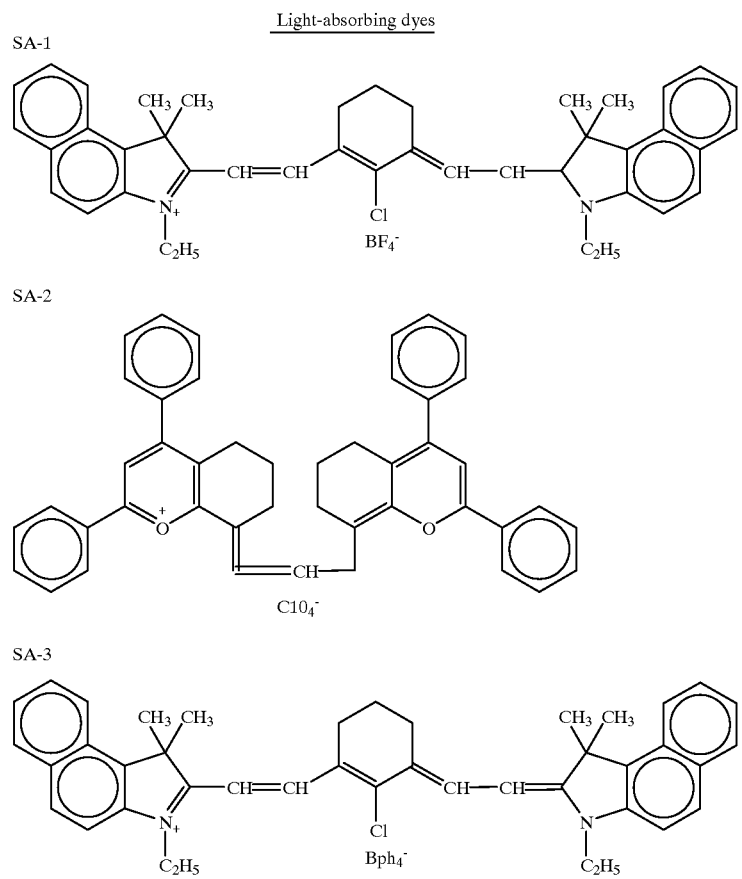

-continued
SA-4
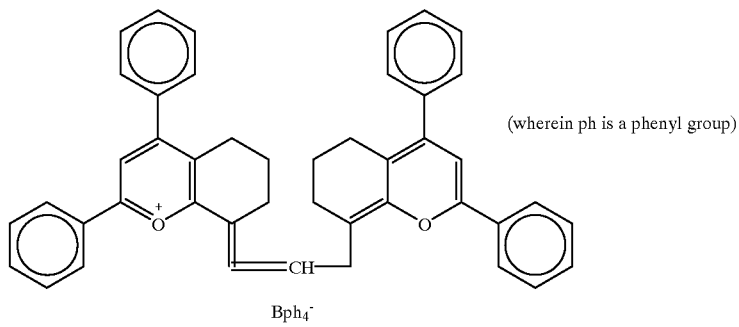
(wherein ph is a phenyl group)
SA-5 Carbon black (MA220, manufactured by Mitsubishi Chemical Corporation)
SA-6 Titanium monoxide (Titan Black 12S, manufactured by Mitsubishi Material K.K.)
Dyes which have no character of acid color formation
TC-1
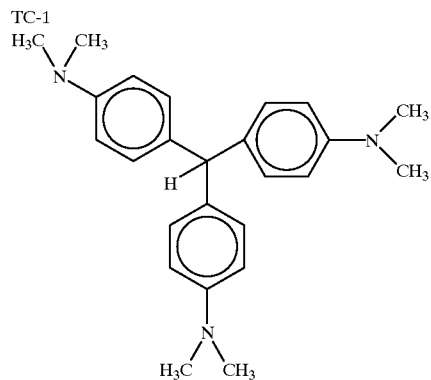
TC-2
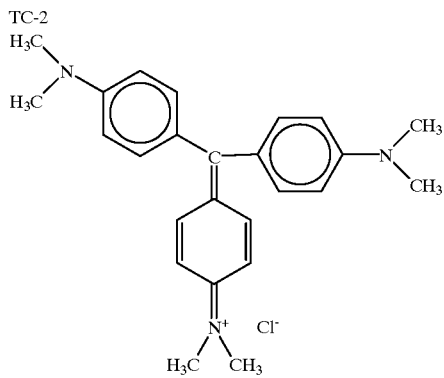
Acid color forming dyes having a lactone skeleton
TB-1
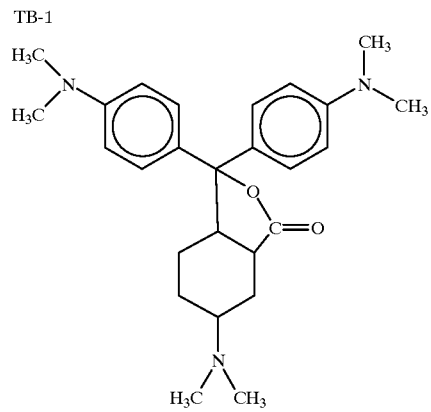
TB-2
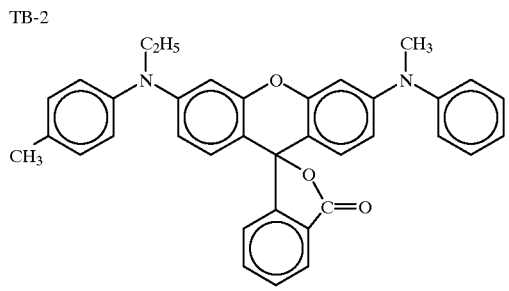

-continued
TB-3
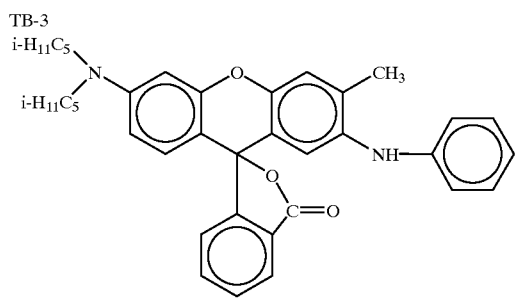
TB-4
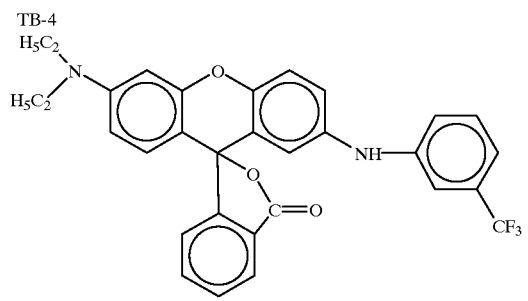
TB-5
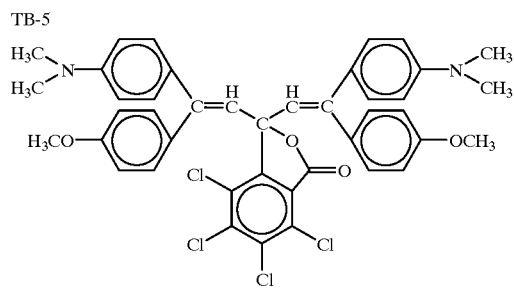
TB-7
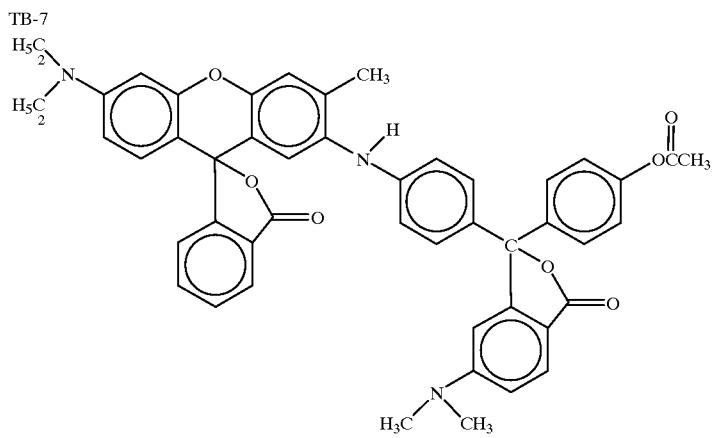
TB-8
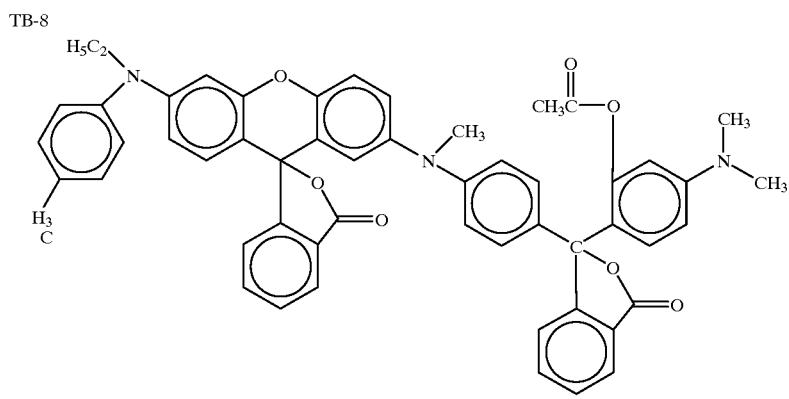

TB-9
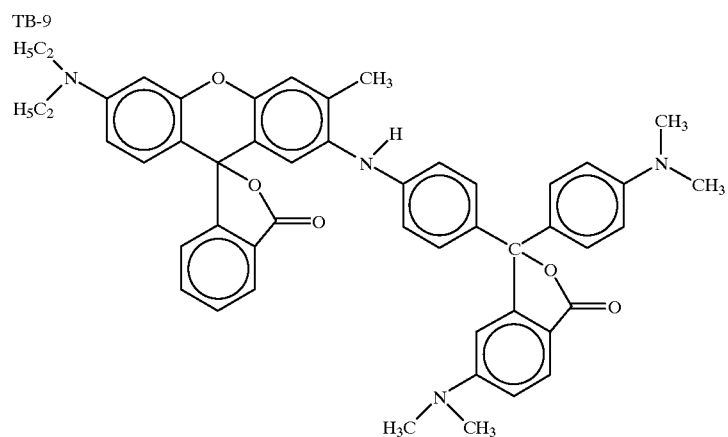
TB-10
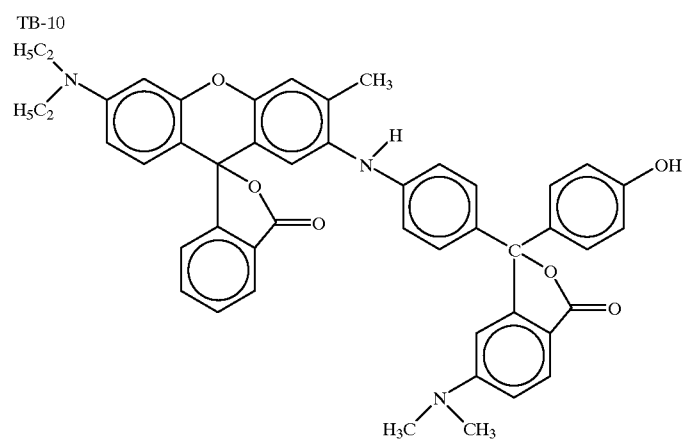
TB-11
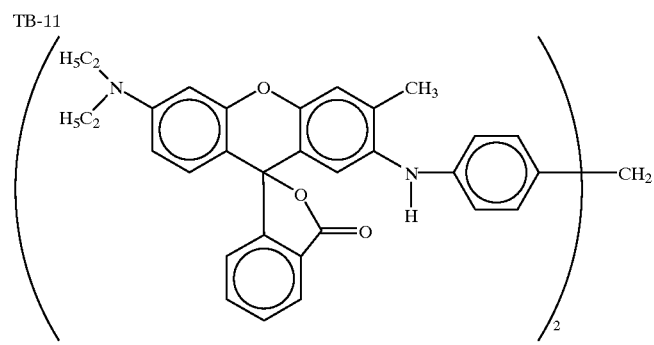
TB-12
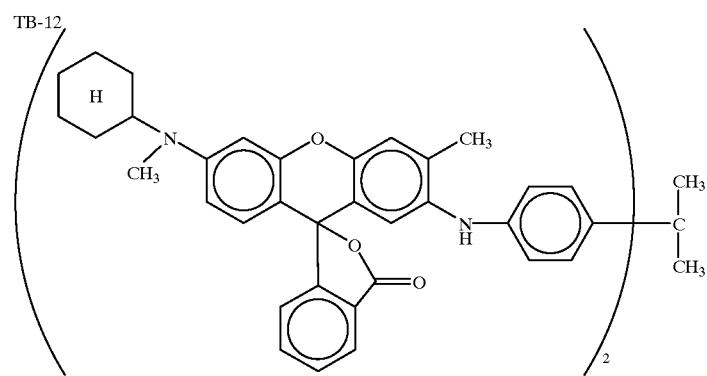

-continued

TB-13

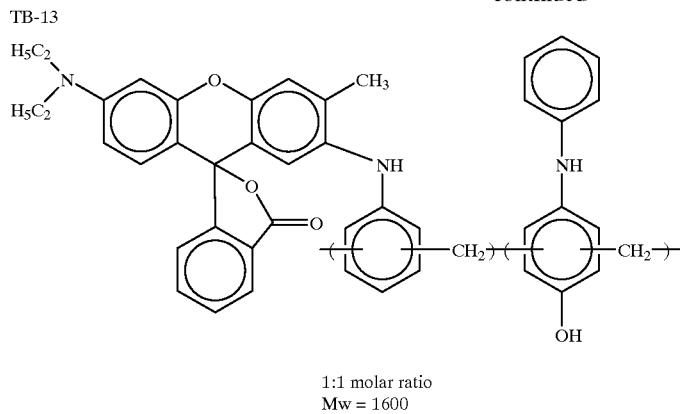

1:1 molar ratio
Mw = 1600

EXAMPLES 1 TO 7 AND COMPARATIVE EXAMPLES 1 TO 3

A photosensitive liquid comprising the following components, was coated by a wire bar on an aluminum plate prepared by the above described method and dried at 90° C. for 2 minutes, followed by heat treatment at 55° C. for 16 hours to obtain a lithographic printing plate. The coating amount was 2.8 g/m2. In the state of the photosensitive liquid, no substantial color development was observed, and with a sample obtained by coating, followed by drying in air at room temperature, the dye having a lactone group did not undergo color development, whereby only an extremely pale color of the light absorbing dye, was observed. But, by the drying at 85° C. for 2 minutes and heat treatment at 55° C. for 16 hours, the dye having a lactone group underwent color formation, and the density of the color-formed dye was observed to have increased at least 5 times the color density of one coated and dried in air in reflection absorbence.

Photosensitive Liquid

High molecular compound: novolak resin (Mw 4000) having phenol/m-cresol/p-cresol (20/50/30 molar ratio) co-condensed with formaldehyde
100 parts by weight Light-absorbing dye: one as identified in Table A
5 parts by weight Acid color forming dye having a lactone skeleton: one as identified in Table A
10 parts by weight Solvent: cyclohexanone/N-methyl pyrrolidone (mixture)
600 parts by weight/300 parts by weight Then, the above sample was subjected to image exposure of 212 lines and from 3 to 97% halftone dot images with various exposure energies by means of a photosensitive lithographic printing plate exposure apparatus (Trend Setter 3244T, manufactured by Creo K.K.). Then, an alkaline developer (SDR-1, manufactured by Konica K.K.) was diluted 7 times, and development was carried out at 28° C. Evaluation of the sensitivity was carried out by using the exposure at which the 3% half tone dot image was reproduced, The lower the exposure, the higher the sensitivity. The results are shown in Table A.

TABLE A

| No. | Acid color forming dye having a lactone skeleton | Dye which is not acid color developable | Light absorbing dye | Sensitivity (mJ/cm2) (830 nm) | Remaining coating ratio |
|---|---|---|---|---|---|
| Example 1 | TB-1 | — | SA-1 | 300 | A |
| Comparative Example 1 | — | TC-1 | SA-1 | F | F |
| Comparative Example 2 | — | TC-2 | SA-1 | G | F |
| Comparative Example 3 | — | — | SA-1 | 800 | D |
| Example 2 | TB-2 | — | SA-1 | 400 | A |
| Example 3 | TB-3 | — | SA-1 | 400 | A |
| Example 4 | TB-1 | — | SA-2 | 200 | A |
| Example 5 | TB-2 | — | SA-2 | 300 | A |
| Example 6 | TB-4 | — | SA-4 | 400 | A |
| Example 7 | TB-5 | — | SA-3 | 200 | A |

*) In the column for the sensitivity, F means that the entire surface was dissolved, whereby no image was formed, and G means that the solubility of the photosensitive layer was so low that no image was formed, and therefore, physical stimulation was given with a sponge until the non-image portion was removed, whereby the entire surface was dissolved and no image was formed. In the column for the remaining coating ratio, F means that no evaluation was carried out.

REFERENCE EXAMPLE 1

The photosensitive lithographic printing plate of Example 1 was left to stand for 10 hours under irradiation by a white fluorescent lamp (36 W white fluorescent lamp Neolumisuper FLR40S-W/M/36, manufactured by Mitsubishi Electric Co., Ltd.) with a light intensity of 400 lux, whereupon evaluation was carried out in the same manner as in Example 1, whereby the same levels of sensitivity (300 mJ/cm$^2$) and remaining coating ratio (A) as in Example 1 were obtained.

REFERENCE EXAMPLE 2

The other hand, a photosensitive lithographic printing plate was prepared and evaluated in the same manner as in Example 1 except that 10 parts by weight of the following o-quinone diazide:

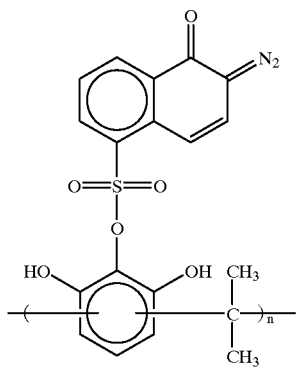

was added to the photosensitive composition, whereby the sensitivity was 350 mJ/cm², and the remaining coating ratio was A. However, when it was left to stand for 5 hours under irradiation by the white fluorescent lamp in the same manner as in Reference Example 1, and then evaluation was carried out in the same manner, whereby a reduction of the photosensitive layer of at least 30% was observed.

EXAMPLES 8 TO 14

Samples were prepared and evaluated in the same manner as in Example 1 except that the acid color forming dye having a lactone skeleton was changed to the acid color forming dyes having a bis-form skeleton or an organic polymer skeleton as identified in Table B, and the solvent was changed to cyclohexanone. The results are shown in Table B.

EXAMPLES 15 AND 16

Samples were prepared and evaluated in the same manner as in Example 8 except that the light-absorbing dye was changed to those identified in Table B. the results are shown in Table B.

TABLE B

| Example | Acid color forming dye | Light absorbing dye | Sensitivity (mJ/cm2) (830 nm) | Remaining coating ratio |
|---|---|---|---|---|
| 8 | TB-7 | SA-1 | 200 | A |
| 9 | TB-8 | SA-1 | 210 | A |
| 10 | TB-9 | SA-1 | 180 | A |
| 11 | TB-10 | SA-1 | 200 | A |
| 12 | TB-11 | SA-1 | 200 | A |
| 13 | TB-12 | SA-1 | 180 | A |
| 14 | TB-13 | SA-1 | 270 | A |
| 15 | TB-7 | SA-5 | 500 | A |
| 16 | TB-7 | SA-6 | 500 | A |

EXAMPLE 17

The samples of Examples 1 to 16 and Comparative Example 2 were subjected to laser exposure with 1,000 mJ/cm², and the visual images after exposure were evaluated by means of a reflection density meter RD-514, manufactured by Macbeth Company.

With the exposed sample of Comparative Example 2, it was difficult to visually distinguish the exposed portion and the non-exposed portion with no substantial discoloration of the added dye TC-2 at the exposed portion (the change in the color density being less than 1%). Whereas, with the exposed samples of Examples 1 to 16, it was possible to readily visually distinguish the exposed portion and the non-exposed portion with discoloration of the added acid color forming dyes, whereby a change in the density of at least 5%, was observed.

Further, with the exposed samples of Examples 1 to 16, the laser exposed images were readily confirmed even during the laser exposure with an exposure required to reproduce a 3% halftone dot image.

EXAMPLE 18

The sample of Example 1 was subjected to laser exposure so that the energy of the plate surface was 500 mJ/cm² over the entire surface and then cut out in a square size of 20 cm×20 cm. Then, the sample of Comparative Example 2 was likewise subjected to laser exposure so that the energy on the plate surface was 800 mJ/cm² and then cut out in a square size of 20 cm×20 cm.

Then, each sample of 20 cm×20 cm was subjected to development treatment with 200 ml of a solution having an alkali developer (SDR-1, manufactured by Konica K.K.) diluted 7 times to remove the photosensitive layer of the sample entirely, whereupon the presence or absence of coloring of the developer was visually observed. Whereby no coloring was observed with the developer which the sample of Example 1 was treated, while remarkable coloring by the dye TC-2 was observed with the developer with which the sample of Comparative Example 2 was treated.

EXAMPLE 19 TO 23

Samples were prepared and evaluated in the same manner as in Example 1 except that the acid color forming dye was changed to the following dyes TD-1, TD-2, TD-3, TD-4, respectively. The results are shown in Table C.

TABLE C

| Example | Acid color forming dye | Light absorbing dye | Sensitivity (mJ/cm2) (830 nm) | Remaining coating ratio |
|---|---|---|---|---|
| 19 | TD-1 | SA-1 | 300 | A |
| 20 | TD-2 | SA-1 | 300 | A |
| 21 | TD-3 | SA-1 | 800 | B |
| 22 | TD-4 | SA-1 | 800 | B |

TD-1

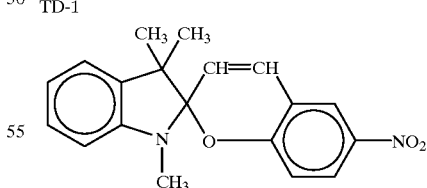

TD-2

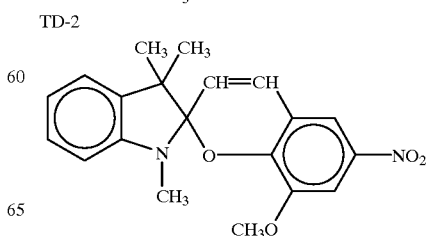

TABLE C-continued

| Example | Acid color forming dye | Light absorbing dye | Sensitivity (mJ/cm2) (830 nm) | Remaining coating ratio |
|---|---|---|---|---|
| TD-3 | 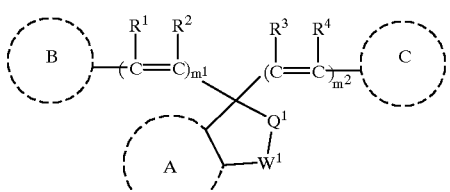 | | | |
| TD-4 | | | | |

The photosensitive composition of the present invention is excellent in contrast between an exposed portion and a non-exposed portion and provides an adequate remaining coating ratio at an image portion, and thus, it is useful for a photosensitive lithographic printing plate having a layer of the composition formed on a support. Further, the photosensitive lithographic printing plate having a photosensitive layer made of the photosensitive composition of the present invention, is excellent in the exposure visible image property. Further, it has a merit in that coloring or contamination of the developer is little even when the photosensitive lithographic printing plates are developed in a large quantity.

What is claimed is:

1. A positive photosensitive lithographic printing plate having a photosensitive layer formed on a support, said photosensitive layer being made of a positive photosensitive composition comprising an alkali-soluble organic high molecular substance having phenolic hydroxyl groups, an acid color forming dye and a photo-thermal conversion material which generates heat upon absorption of light from a light source for image exposure.

2. The positive photosensitive lithographic printing plate according to claim 1, wherein at least a part of the acid color forming dye forms a proton transfer complex with the alkali-soluble organic high molecular substance having phenolic hydroxyl groups.

3. The positive photosensitive lithographic printing plate according to claim 1, wherein the alkali-soluble organic high molecular substance having phenolic hydroxyl groups, is at least one member selected from a novolak resin, a resol resin and a polyvinyl phenol resin.

4. The positive photosensitive lithographic printing plate according to claim 1, wherein the acid color forming dye has an acid-dissociable lactone structure.

5. The positive photosensitive lithographic printing plate according to claim 1, wherein the acid color forming dye is a compound of the following formula (A1):

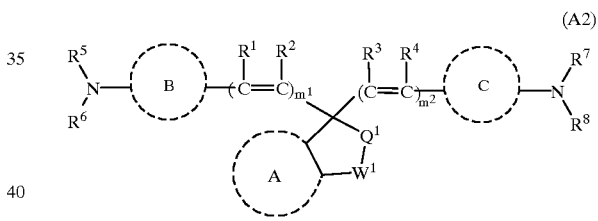

(A1)

wherein each of rings A, B and C which are independent of one another, is a mono- to tri-nuclear aromatic hydrocarbon group which may have a substituent, or a mono- to tri-nuclear aromatic heterocyclic group which may have a substituent, $W^1$ is a carbonyl group, a thio carbonyl group or a group of the formula —$C(R^{25})$=N—, $R^{25}$ is a hydrogen atom or a hydrocarbon group which may have a substituent, Q1 is an oxygen atom, a sulfur atom or an imino group which may have a substituent, each of $R^1$ to $R^4$ which are independent of one another, is a hydrogen atom or a hydrocarbon group which may have a substituent, $m^1$ is 0 or 1, $m^2$ is 0 or 1, and rings B and C may be bonded to each other via a connecting group, provided that ring B and/or ring C has at least one substituent selected from an amino group which may have a substituent, an alkoxy group which may have a substituent, an aryloxy group which may have a substituent, an alkylthio group which may have a substituent, and an arylthio group which may have a substituent.

6. The positive photosensitive lithographic printing plate according to claim 5, wherein the acid color forming dye is a compound of the following formula (A2):

(A2)

wherein each of rings A, B and C which are independent of one another, is a mono- to tri-nuclear aromatic hydrocarbon group which may have a substituent, or a mono- to tri-aromatic heterocyclic group which may have a substituent, $W^1$ is a carbonyl group, a thio carbonyl group or a group of the formula —$C(R^{25})$=N—, $R^{25}$ is a hydrogen atom or a hydrocarbon group which may have a substituent, Q1 is an oxygen atom, a sulfur atom or an imino group which may have a substituent, each of $R^1$ to $R^4$ which are independent of one another is a hydrogen atom or a hydrocarbon group which may have a substituent, $m^1$ is 0 or 1, $m^2$ is 0 or 1, each of $R^5$ to $R^8$ which are independent of one another, is a hydrogen atom, a hydrocarbon group which may have a substituent, or an acyl group which may have a substituent, and rings B and C may be bonded to each other via a connecting group, $R^5$ or $R^6$ and ring B may be bonded to each other via a connecting group, and $R^7$ or $R^8$ and ring C may be bonded to each other via a connecting group.

7. The positive photosensitive lithographic printing plate according to claim 6, wherein in the formula (A2), $W^1$ is a carbonyl group, and $Q^1$ is an oxygen atom.

8. The positive photosensitive lithographic printing plate according to claim 6, wherein in the formula (A2), ring A is a benzene ring, and each of rings B and C which are independent of each other, is a benzene ring or a naphthalene ring.

9. The positive photosensitive lithographic printing plate according to claim 1, wherein the acid color forming dye is a compound of the following formula (A3):

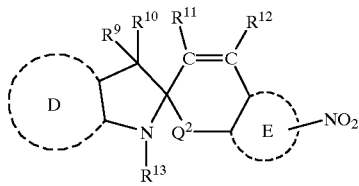

(A3)

wherein each of rings D and E which are independent of each other, is a mono- to tri-nuclear aromatic hydrocarbon which may have a substituent, or a mono- to tri-nuclear aromatic heterocyclic group which may have a substituent, $Q^2$ is an oxygen atom or a sulfur atom, each of $R^9$ to $R^{12}$ which are independent of one another, is a hydrogen atom, a halogen atom or a hydrocarbon group which may have a substituent, and $R^{13}$ is a hydrogen atom or a hydrocarbon group which may have a substituent.

10. The positive photosensitive lithographic printing plate according to claim 1, wherein the acid color forming dye is compound of the following formula (A-4):

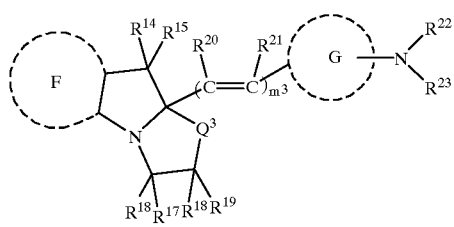

(A4)

wherein rings F and G which are independent of each other, is a mono- to tri-nuclear aromatic hydrocarbon group which may have a substituent, or a mono- to tri-nuclear aromatic heterocyclic group which may have a substituent, each of $R^{14}$ to $R^{21}$ which are independent of one another, is a hydrogen atom or a hydrocarbon group which may have a substituent, each of $R^{22}$ and $R^{23}$ which are independent of each other, is a hydrogen atom, a hydrocarbon group which may have a substituent, or an acyl group which may have a substituent, $Q^3$ is an oxygen atom or a sulfur atom, and $m^3$ is 1 or 2.

11. The positive photosensitive lithographic printing plate according to claim 1, wherein the photo-thermal conversion material is a near infrared-absorbing dye.

12. The positive photosensitive lithographic printing plate according to claim 1, which undergoes substantially no significant change in the solubility to an alkali developer, when left to stand for 10 hours under irradiation of white light with a light intensity of 400 lux.

13. A method for forming a positive image, which comprises subjecting a positive photosensitive lithographic printing plate as defined in claim 12, to exposure with a near infrared light ray of from 650 to 1,300 nm, followed by development with an alkali developer.

14. The method according to claim 13, wherein in the positive photosensitive composition at least a part of the acid color forming dye forms a proton transfer complex with the alkali-soluble organic high molecular substance having phenolic hydroxyl groups.

15. The method according to claim 13, wherein in the positive photosensitive composition the alkali-soluble organic high molecular substance having phenolic hydroxyl groups, is at least one member selected from a novolak resin, a resol resin and a polyvinyl phenol resin.

16. The method according to claim 13, wherein in the positive photosensitive composition the acid color forming dye is a compound of the following formula (A2):

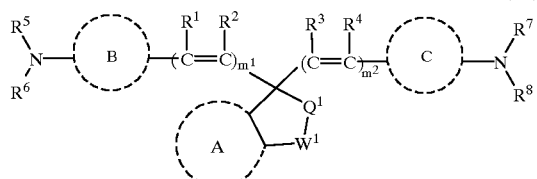

(A2)

wherein each of rings A, B and C which are independent of one another, is a mono- to tri-nuclear aromatic hydrocarbon group which may have a substituent, or a mono- to tri-aromatic heterocyclic group which may have a substituent, $W^1$ is a carbonyl group, a thio carbonyl group or a group of the formula —C($R^{25}$)=N—, $R^{25}$ is a hydrogen atom or a hydrocarbon group which may have a substituent, $Q^1$ is an oxygen atom, a sulfur atom or an imino group which may have a substituent, each of $R^1$ to $R^4$ which are independent of one another is a hydrogen atom or a hydrocarbon group which may have a substituent, $m^1$ is 0 or 1, $m^2$ is 0 or 1, each of $R^5$ to $R^8$ which are independent of one another, is a hydrogen atom, a hydrocarbon group which may have a substituent, or an acyl group which may have a substituent, and rings B and C may be bonded to each other via a connecting group, $R^5$ or $R^6$ and ring B may be bonded to each other via a connecting group, and $R^7$ or $R^8$ and ring C may be bonded to each other via a connecting group.

17. The method according to claim 16, wherein in the formula (A2), $W^1$ is a carbonyl group and $Q^1$ is an oxygen atom.

* * * * *